US012578383B2

(12) United States Patent
Gilabert et al.

(10) Patent No.: US 12,578,383 B2
(45) Date of Patent: Mar. 17, 2026

(54) TECHNOLOGIES FOR VERIFYING AND VALIDATING ELECTRONIC DEVICES USING ELECTROLUMINESCENCE

(71) Applicant: Battelle Memorial Institute, Columbus, OH (US)

(72) Inventors: Russell Gilabert, Lewis Center, OH (US); Thomas Kent, Columbus, OH (US); Katie T. Liszewski, Powell, OH (US); Christian Meadows, Columbus, OH (US); Jeffrey A. Simon, Columbus, OH (US)

(73) Assignee: Battelle Memorial Institute, Columbus, OH (US)

( * ) Notice: Subject to any disclaimer, the term of this patent is extended or adjusted under 35 U.S.C. 154(b) by 259 days.

(21) Appl. No.: 18/068,557

(22) Filed: Dec. 20, 2022

(65) Prior Publication Data
US 2023/0194599 A1 Jun. 22, 2023

Related U.S. Application Data

(60) Provisional application No. 63/291,618, filed on Dec. 20, 2021.

(51) Int. Cl.
*G01R 31/311* (2006.01)
*G01N 21/00* (2006.01)
(Continued)

(52) U.S. Cl.
CPC ........... *G01R 31/311* (2013.01); *G01N 21/00* (2013.01); *G01R 31/305* (2013.01);
(Continued)

(58) Field of Classification Search
CPC .. G01R 31/311; G01R 31/305; G01R 31/308; G01N 21/00; G06T 7/001;
(Continued)

(56) References Cited

U.S. PATENT DOCUMENTS

| | | |
|---|---|---|
| 5,940,545 A | 8/1999 | Kash et al. |
| 7,378,859 B2 | 5/2008 | Stellari et al. |

(Continued)

OTHER PUBLICATIONS

"Photon Emission Microscopy, Emission of photons from p/n junctions, Photo emission: theory, Fundamental Spectra", STFA 2019 Tutorial Slides, 45th International Symposium for Testing and Failure Analysis, Nov. 2019, p. 465.
(Continued)

*Primary Examiner* — Amy He
(74) *Attorney, Agent, or Firm* — Grossman, Tucker, Perreault & Pfleger, PLLC; Donald G. Weiss

(57) ABSTRACT
In an approach to inspecting integrated circuits, a system includes a first detection system and a second detection system for measuring electroluminescent (EL) images from a device under test (DUT); and a controller. The controller is configured to: measure EL emissions from the DUT with the first and the second detection systems to obtain a first and a second EL test data; compare the first and the second EL test data to a reference model of a reference device, the reference model developed based on measured EL reference data, synthetic EL reference data, or a combination thereof obtained from the reference device or a reference design of the reference device; and determine whether the DUT is in accordance with the reference device, based at least in part on the comparison of the first and the second EL test data to the reference model of the reference device.

17 Claims, 12 Drawing Sheets

100

Start
101

Produce Reference Model
103

Measure Device Under Test
105

Compare Reference Model to Device Under Test
107

Device Under Test Within Specification? 109

YES → Report Device Within Specification 111

NO → Report Device Out of Specification 113

End
115

(51) Int. Cl.

| | |
|---|---|
| *G01R 31/305* | (2006.01) |
| *G01R 31/308* | (2006.01) |
| *G06T 7/00* | (2017.01) |

(52) U.S. Cl.
CPC ............ *G01R 31/308* (2013.01); *G06T 7/001* (2013.01); *G06T 2207/20081* (2013.01); *G06T 2207/30148* (2013.01)

(58) Field of Classification Search
CPC . G06T 2207/20081; G06T 2207/30148; G06T 2207/10048; G06F 21/44
See application file for complete search history.

(56) References Cited

U.S. PATENT DOCUMENTS

| | | | |
|---|---|---|---|
| 8,115,170 B2 | 2/2012 | Stellari et al. | |
| 9,075,106 B2 | 7/2015 | Bernstein et al. | |
| 9,581,642 B2 | 2/2017 | Song et al. | |
| 10,147,175 B2 | 12/2018 | Bahgat Shehata et al. | |
| 2015/0293037 A1* | 10/2015 | Deslandes .......... | G01N 21/9501 356/237.5 |
| 2017/0177853 A1* | 6/2017 | Ewing ................... | H01L 23/576 |
| 2021/0063482 A1* | 3/2021 | Stellari ............... | G01R 31/311 |

OTHER PUBLICATIONS

Maxime Cozzi, Infrared Imaging for Integrated Circuit Trust and Hardware Security, Micro and Nanotechnologies/Microelectronics, Universite Montpellier, 2019.

Ulrike Jahn et al., Review on Infrared and Electroluminescence Imaging for PV Field Applications, International Energy Agency, Photovoltaic Power Systems Programme, Report Iea-pvps T13-10:2018, Mar. 2018.

* cited by examiner

100

200

400

SWIR Electroluminescent Image of an Integrated Circuit
Device

Single Photon Counting
Spectrum – Single Location

Single Photon Counting Spectrum –
Multiple Locations

TECHNOLOGIES FOR VERIFYING AND VALIDATING ELECTRONIC DEVICES USING ELECTROLUMINESCENCE

CROSS-REFERENCE TO RELATED APPLICATIONS

The present application claims the benefit of the filing date of U.S. Provisional Application Ser. No. 63/291,618, filed Dec. 20, 2021, the entire teachings of which application is hereby incorporated herein by reference.

TECHNICAL FIELD

The present disclosure relates to technologies for verifying and validating electronic devices using electroluminescence. In particular, the present disclosure relates to systems and methods that utilize electroluminescence to determine whether a device under test is functioning or physically designed in a manner that is consistent with a reference model of a reference device or design.

BACKGROUND

Over the last 50 years advances in integrated circuits (ICs) have led to the production of IC devices of immense complexity and very small feature (node) size. Due to the specialized facilities and skill required to manufacture functional IC devices at advanced node sizes, modern designers of IC devices are often unable to physically manufacture their designs. Rather, such designers often outsource production of their IC designs to specialized manufacturing facilities, which may be in a foreign country. As a result, the production of modern IC devices now often involves the use of complex international supply chains. In the defense sector this can present a security issue, as the supply chain for producing a complex IC device may be difficult or impossible to secure using traditional defense industry solutions such as clearance and surveillance. This concern is augmented by the fact that—due to the small node sizes and complex designs involved—it can be difficult to detect whether the design of an IC was faithfully reproduced or modified during the manufacturing process.

Physical inspection of a manufactured IC part may be performed to determine whether an IC design was faithfully reproduced by a manufacturer. In many cases physical inspection involves carefully de-packaging and/or delayering an IC device and imaging the layers of the device with a scanning electron microscope. Such a process is difficult, time consuming, expensive. Physical inspection also results in destruction of the inspected part, and thus cannot be performed on all IC devices in a batch of ICs produced by the manufacturer. Physical inspection also does not enable detection of unauthorized software or firmware executing on an IC device. As a result, physical inspection may not detect a physically modified or software/firmware modified IC in a batch of IC parts.

A need therefore remains in the art for improved—and particularly non-destructive—systems and methods for inspecting IC devices for trust and validation purposes. The present disclosure is aimed at that need and provides systems and methods that can nondestructively verify operation of an IC device, software/firmware executing on an IC device, and/or the process by which the IC device was manufactured.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

Figure 1A:
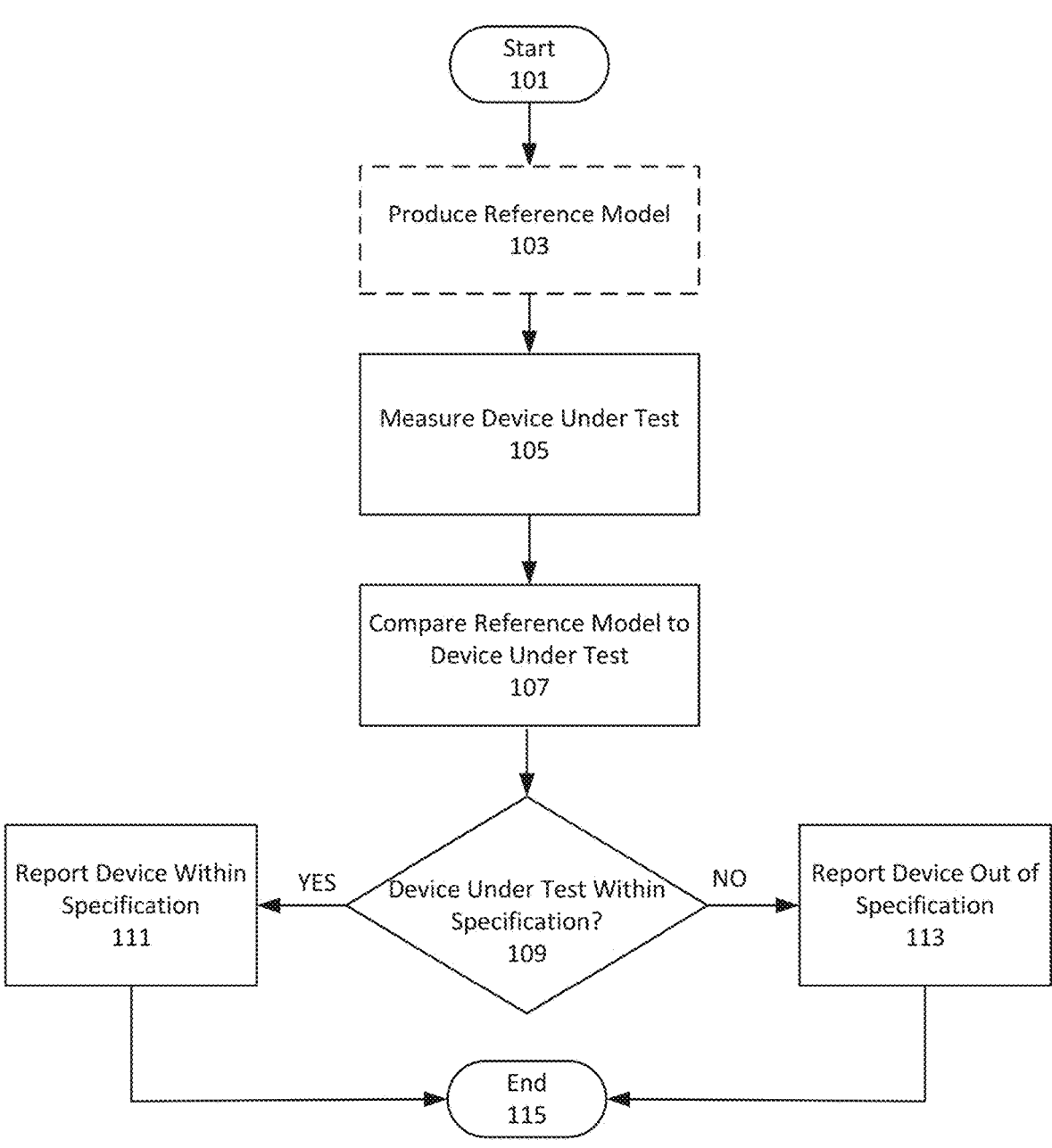
FIGS. 1A-1C are a flow chart of example operations of one example of a method of inspecting an integrated circuit device consistent with the present disclosure.

Although the following Detailed Description will proceed with reference being made to illustrative embodiments, many alternatives, modifications, and variations thereof will be apparent to those skilled in the art.

DETAILED DESCRIPTION

As used herein the term "synthetic" refers to an output that is produced by a computer or other electronic device that applies a machine learning algorithm to convert input data to output data. For example, predicted/calculated images, spectra, timing, etc. (e.g., a single photon spectrum, infrared spectrum, visible spectrum, short wave infrared (SWIR) images, hyperspectral images, etc.) of the electroluminescent (EL) output (also referred to herein as "EL activity") of an IC device are non-limiting examples of example of a synthetic output. A predicted/calculated spectrum from an IC device is another example of a synthetic output.

As used herein, the terms "test part" and "device under test," and "DUT" each refer to an IC device that is being inspected using a system or method consistent with the present disclosure.

As used herein, the terms "known good device," and "reference device" each refer to an IC device that is known to be trustworthy (i.e., consistent with a target design and/or executing approved software/firmware).

As used herein, "reference specification," "reference circuit," and "reference design" are used interchangeably herein to mean the physical (hardware) design of a reference device (i.e., the actual physical hardware of a reference device or an electronic representation thereof, such as may be included in a graphic design system ii (GDSII) or other computer file format), the approved software or firmware executing on a reference device, the properties of one or more layers of a reference device (e.g., material composition, doping, thickness, etc.), or a combination thereof.

As used herein, "EL test data" means data obtained by performing one or more electroluminescent (EL) measurements on a DUT. Preferably, EL test data is produced by measuring EL emissions resulting from hot electron emissions from a DUT, in contrast to measuring EL emissions resulting from leakage current or other defects that may be present in the DUT. In contrast, "EL reference data" means data obtained by measuring EL emissions from a reference device, simulating EL emissions from a reference specification, or a combination thereof. EL reference data can also include information from other sources, such as descriptions of firmware, software, netlist, or the like of operations that are expected to occur within an IC during execution of said firmware, software, netlist, etc. For clarity, EL reference data obtained from simulations of EL emissions resulting from a reference specification may be referred to herein as "synthetic EL reference data." In contrast, EL reference data obtained from measurements of EL emissions from a reference device may be referred to as "measured EL reference data." Preferably, the EL reference data is measured or simulated EL emissions resulting from hot electron emissions from a reference device (or a reference specification), in contrast to emissions resulting from leakage current or other defects.

As noted in the background, physical inspection of IC parts can be performed to determine if IC parts were faithfully produced by a manufacturer in accordance with an intended (target) IC design. Physical inspection is difficult and time consuming and can result in the destruction of the test part under examination. Consequently, physical inspection cannot be performed on all ICs (i.e., in a batch) produced in a production run. As a result, physical inspection may not detect a modified IC in a batch, particularly if the modified IC was not inspected. Moreover, physical inspection of IC's does not allow the detection of unauthorized firmware or software on an IC. When ICs are produced for sensitive applications such as defense applications, the limited ability of physical inspection to detect physically modified IC devices and IC devices executing unauthorized software or firmware can be present a significant security risk. Physical inspection of IC devices is also inefficient, as it is time consuming and results in the destruction of one or more parts in a batch.

With the foregoing in mind, the present disclosure relates to systems and methods for verification and validation of electronic devices (particularly ICs) using electroluminescent imaging. As will be described in detail, the systems and methods described herein compare EL test data obtained from a device under test (DUT) to a reference model to determine various characteristics of the DUT for trust and verification purposes. For example, the systems and methods may compare EL test data to a reference model produced from measured and/or synthetic EL reference data. In embodiments the reference model is produced using measured EL reference data obtained from a reference device executing known software and/or firmware. Examples of EL measurements that may performed on a reference device to obtain measured EL reference data include SWIR imaging, hyperspectral imaging, single photon counting, time correlated single photon counting, infrared spectroscopy, visible spectroscopy, combinations thereof and the like. Alternatively, or additionally, the reference model may be produced using synthetic EL reference data, i.e., EL reference data produced from simulations or calculations based on a reference specification of a reference device executing known good software and/or firmware. Preferably, the reference EL data includes one or both of measured and simulated EL reference data from a plurality of different test modalities. Put differently, the reference EL data may include synthetic or measured EL data from at least two different measurement modalities, such as at least two of SWIR imaging, hyperspectral imaging, single photon counting, time correlated single photon counting, infrared spectroscopy, visible spectroscopy, combinations thereof, and the like.

The EL test data may be obtained by measuring a DUT using the same or similar measurements that were used to obtain the EL reference data used to produce the reference model (i.e., the measured EL reference data and/or the synthetic EL reference data). For example, if the reference model is generated based on a combination of first EL reference data (e.g., measured SWIR images of a reference device or simulated from a reference specification) and second EL reference data (e.g., measured time correlated single photon counting data measured from the reference device or simulated from a reference specification), the EL test data may include at least SWIR images and time correlated single photon counting data of EL emissions from the DUT. If the EL reference data includes synthetic EL reference data, the EL test data may include data obtained using a measurement consistent with the simulations/calculations used to produce the synthetic EL reference data. For example, if the EL reference data includes simulated SWIR images of a reference device, the EL test data may include SWIR measurements of DUT.

Based on the comparison of the EL test data and the reference model the systems and methods herein can determine whether the DUT is in accordance with a reference specification. In embodiments, the systems and methods described herein indicate that a DUT is consistent with a specification of a reference device or reference specification when test EL data from the DUT matches the reference model within a confidence threshold. The confidence threshold may indicate a degree to which the test EL data matches or differs from the reference model. For example, the confidence threshold may indicate that a DUT is within a reference specification if the measured data differs from the reference model by less than or equal to about 10%, such as less than or equal to about 5%, or even less than or equal to about 1%. Alternatively or additionally, the confidence threshold may be used to identify or "flag" specific areas of an IC device wherein EL test data does and does not match EL reference data, thereby producing a confidence map of the DUT that includes indicators of the degree to which it is believed that the EL activity at specific locations of the DUT matches EL activity of a reference device at those locations. For example, and as described herein, timing data may be obtained by measuring EL activity of specific locations of an IC device with a single photon counting detector, such as a time correlated single photon counter. In such instances, the timing data may be used to generate frequency maps of activity at specific locations of a DUT. Such frequency maps (e.g., test frequency maps) can then be compared to reference frequency maps (i.e., frequency maps generated from measured or synthetic timing data of a reference device) to determine whether the DUT is operating in accordance with expectations. Alternatively, or additionally, image data (e.g., from SWIR imaging) and or spectroscopy data may be used to form a reference "heat" map of the EL activity at different portions of a reference device, which may then be compared against a heat map obtained by performing similar measurements on a DUT.

In embodiments, EL reference data may indicate, for example, that EL activity will occur at specific locations on an IC device when certain software/firmware is executed on the IC device. With that in mind, verification of the software/firmware of a DUT can be performed by comparing EL activity (e.g., timing data) measured from the DUT (i.e., EL test data) at the same locations that were measured/simulated to produce the EL reference data and comparing the EL test data to corresponding EL reference data. If there is a mismatch between the EL test data and the EL reference data, a determination can be made that there is something wrong with the DUT, e.g., its software/firmware is not operating correctly, there is malware executing on the DUT, the DUT was not manufactured in accordance with a reference specification, etc.

In embodiments the reference model is or includes a convolution of measured and/or synthetic EL reference data from a known good reference. For example, in some instances the reference model includes an aggregation of multiple sets of measured or synthetic EL reference data obtained from a known good reference using multiple different test modalities. As noted above, the EL reference data may be obtained by measuring (or simulating) the EL activity (particularly EL activity resulting from hot electron emission) of a reference device as it is operated in accordance with a designed test methodology. For example, EL reference data may be obtained by measuring or simulating the EL emissions of a reference device using at least one (and preferably two or more) of SWIR imaging, SWIR spectroscopy, hyperspectral imaging, single photon timing data from one or a plurality of locations, time correlated single photon counting from one or a plurality of locations, stimulated emission analysis, infrared spectroscopy, visible spectroscopy, combinations thereof, and the like. The EL reference data may, in some embodiments, be represented in the form of images of EL activity, timing activity, etc. at various locations on a reference device (e.g., activity heatmap overlaid on a static image of a reference device)—which images may be combined or overlayed with one another to form a composite reference image. Verification and validation of a DUT may then be performed by measuring the EL test data (i.e. EL emissions (particularly those resulting from hot electron emission)) of a DUT using the same test methodology and measurement techniques that were used to produce the EL reference data, and comparing the EL test data to the reference model to determine if the DUT is consistent with a reference design (e.g., by determining whether the reference model and EL test data match within a confidence threshold). For example, when the EL reference data is in the form of a plurality of test images or a composite test image of EL activity of a reference device, images of the EL activity of a DUT may be produced by testing the DUT using the same or similar methodologies used to produce the EL reference data (e.g., by overlaying EL test data on a static image of a DUT). A comparison of corresponding reference and test images (or the composite reference and composite test image) may then be performed to determine if the DUT is consistent with the reference design.

In embodiments the reference model may be produced by aggregating and convolving (e.g., encrypting) EL reference data. In other instances, the reference model may be based on limited test modalities which individually provide little information about the structure of the DUT but can nonetheless serve as a basis for examining the functionality and/or structure of a DUT relative to a reference model. In either case the reference model may be used as a fingerprint of EL activity of a known good reference device. Due to the convolution/encryption of the reference EL data (or the use of limited test modalities), however, it may be difficult or impossible for an unauthorized third party to reverse engineer structural features of the known good reference from the reference model itself, thus improving the security of the reference model. In such instances, the systems and methods described herein may perform verification and validation of a DUT by measuring EL data from the DUT (particularly EL emissions resulting from hot electron emissions) using the same or similar test vectors applied to produce the reference model, thereby producing the first EL test data. The systems and methods may then process the first EL test data in the same manner used to produce the reference model (e.g., aggregation, convolution (encryption), etc.) resulting in the production of second EL test data. The systems and methods may then compare the second EL test data to the reference model to determine whether the second EL test data matches the reference model within a defined confidence threshold. If so, the systems and methods may report that the DUT is within accordance with a target specification. But if not, the systems and methods may report that the DUT is outside the target specification.

Figure 1B:
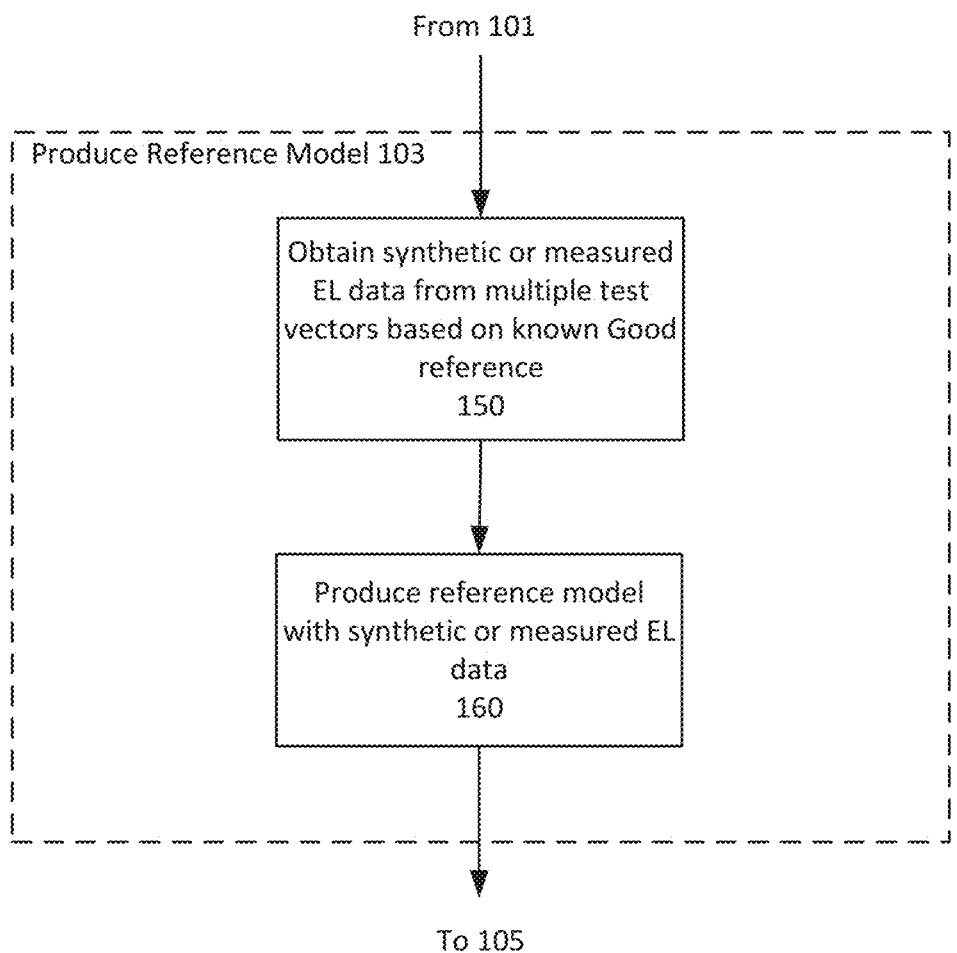

With the foregoing in mind, one aspect of the present disclosure relates to methods for verifying and validating electronic devices using electroluminescence (EL). In that regard reference is made to FIGS. 1A-1C, which is a flow chart of example operations of one example of a method consistent with the present disclosure. With reference to FIG. 1A, method 100 begins with block 101. The method may then proceed to optional block 103, pursuant to which a reference model may optionally be produced. The operations of block 103 are optional in that they may be omitted in instances where a reference model has been previously produced or is otherwise available. As shown in FIG. 1B, production of a reference model may begin in block 150 with obtaining EL reference data based on reference device and/or a reference specification.

In embodiments, EL reference data is obtained by measuring or simulating EL emissions from a reference device or a reference specification using multiple different test modalities. The test modalities may include different EL measurements or simulations of EL measurements of a reference device/specification using the same test protocol. That is, the test modalities may include different EL measurements or simulations of EL measurements where a reference device is operated under the same test conditions (e.g., temperature, software/firmware, etc.). Alternatively, the test modalities may include EL measurements or simulations of EL measurements of a reference device operated under different test conditions, e.g., the same EL measurements/simulations run with the reference device/design operated at a different temperature, or with different software/firmware. Non-limiting examples of suitable test modalities that may be used to produce measured or simulated reference data include SWIR imaging of a reference device, SWIR spectroscopy of a reference device, hyperspectral imaging of a reference device, single photon timing data of EL emissions from one or a plurality of locations on a reference device, time correlated single photon counting of EL emissions from one or a plurality of locations on a reference device, stimulated emission analysis of a reference device, infrared spectroscopy of EL emissions of a reference device, visible spectroscopy of EL emissions of a reference device, combinations thereof, and the like. Preferably, the test modalities measure or simulate EL emissions resulting from hot electron emission from a reference device. Without limitation, in embodiments the EL reference data includes at least first and second EL reference data, wherein the first EL reference data is measured or simulated SWIR images and/or hyperspectral images of EL emissions of a reference device/design, and the second EL reference data is measured or simulated timing data such as single photon counting data or time correlated single photon counting data obtained by performing or simulating single photon counting measurements of EL emissions from one or a plurality of locations of the reference device/design.

It is noted that one form of EL reference/test data may be converted into another form of EL reference/test data, e.g., via data processing. For example, EL reference/test data in the form of EL spectroscopy data may be obtained from spectroscopy measurements on a plurality of points of a reference device or DUT. The EL spectroscopy data could be captured to determine, for example, what wavelengths best capture EL activity of the reference device/DUT. Filters can then be applied to obtain hyperspectral EL images based on the EL spectroscopy data. Reference image(s) of EL activity of a reference device can also be created from EL spectroscopy data of the reference data. A comparison of the reference image and the hyperspectral images from a DUT can then be performed—enabling more rapid but still accurate comparison of the EL activity of a DUT to a reference device.

EL reference/test data may also be converted from one modality to another via other means, such as via a machine learning algorithm. For example, a cyclic generative adversarial network (CGAN) or other machine learning algorithm can be used to convert first EL reference/test data (e.g., hyperspectral images) to second EL reference/test data (e.g., simple EL activity maps, EL frequency maps, etc.). In any case, conversion of EL reference/test data may be performed to facilitate comparison between EL test data and a reference model/EL reference data.

EL reference/test data may also be provided in the form of one or more images as noted above. For example, EL reference/test data may be provided in the form of one or more reference/test images in which activity of the reference/test device is overlaid on an image of a reference/test device. Multiple such images may be aggregated into a single composite reference image or composite test image, which may be compared to one another.

Once the EL reference data is obtained the method may then proceed to block 160, pursuant to which a reference model may be generated using the synthetic and/or measured EL data from the reference device/design as described above. Operations of block 160 may include aggregating the EL reference data into a data structure that is a "fingerprint" of EL activity of the reference device/design in accordance with the relevant test modalities. Alternatively, or additionally, production of the reference model may include convolving (e.g., encrypting) or otherwise processing the EL reference data (e.g., convolving or encrypting at least first and second EL reference data described above). Still further, production of the reference model may involve training a machine learning model with the EL reference data. In such instances the machine learning model may be used to evaluate whether a DUT is in accordance with a reference specification using EL test data (particularly from hot electron emission) obtained by measuring a DUT using the same or similar test vectors that were used in the production of the reference model as discussed further below.

By way of example, in embodiments the operations of block 103 may include identifying test vectors for a reference device and a device under test. The test vectors may include measuring the EL activity of a reference device and DUT for EL activity associated with various operations, such as but not limited to EL activity associated with memory read operations, memory write operations, memory clearance operations, send/receive communication operations (e.g., input/output operations), computation operations (e.g., with a specific processor core), combinations thereof, and the like. A reference model may then be generated by measuring (or synthesizing) EL emissions associated with those test vectors using a reference device and/or reference specification. For example, EL activity associated with memory write operations may be obtained by measuring EL emissions from a memory of a reference device using SWIR imaging, single photon counting, or any of the other detection modalities noted herein. The resulting EL reference data may then be assembled into a data structure (reference model such as a reference EL signature map, reference spatial profile, reference timing map, etc.), which can then be compared to EL test data obtained by performing the same or similar measurements on a DUT. In other embodiments the reference model may be in the form of one or more reference images in which EL reference data is overlaid on an image of a reference device. The resulting EL reference images (or a composite reference image) may then be compared to corresponding test images (or a corresponding composite test image) obtained by overlaying activity measured from a DUT on an image of the DUT. In embodiments, one or more of the reference images and/or composite referring images may be subject to processing to provide a processed reference image that can be compared a corresponding processed test image. For example, one or a plurality of reference images (e.g., a reference image stackup) may be subject to principal component analysis to produce a reference principal component analysis (RPCA) image or a reference principal component analysis stackup, which can then be compared to test principal component analysis (TPCA) images and/or a TPCA stackup produced by analyzing one or more test images or a stackup of test images using principal component analysis. Based on that comparison one or more confidence indicators may be produced and may indicate a degree to which all or a portion of a DUT is consistent with a corresponding portion of a reference device or a reference model.

Figure 1C:
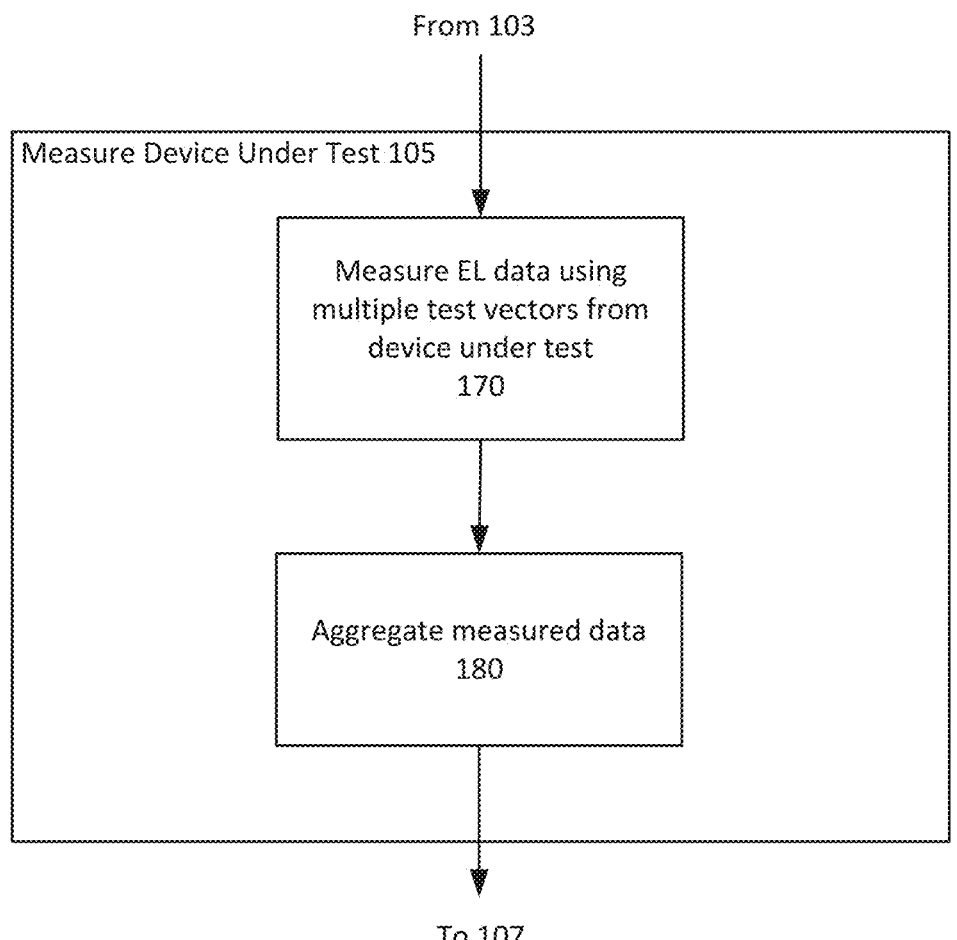

Returning to FIG. 1A, following production of the reference model or if the operations of block 103 are omitted the method may proceed to block 105, pursuant to which the EL output of a DUT may be measured to obtain EL test data. As shown in FIG. 1C, operations of block 105 may begin with block 170, pursuant to which the EL output of a device under test may be measured using multiple test vectors, and preferably the same or similar test vectors that were used to produce the synthetic or measured EL reference data used to produce the reference model. For example, when the reference model was produced using at least first EL reference data (e.g., SWIR images of a reference device) and second EL reference data (e.g., timing data from single photon counting measurements of a reference device), the operations of block 170 may include measuring EL emissions from the DUT in the same manner (i.e., with SWIR imaging and single photon counting).

In instances where hardware verification and validation of the DUT is performed, the operations of block 170 may also include operating the DUT with the same parameters and the same software/firmware that were used to generate the EL reference data. In such instances differences between the EL test data and the reference model may be attributable to hardware or physical differences (e.g., material composition differences) between the DUT and the reference device/ specification. In embodiments when verification of software/ firmware executing on the DUT is being performed, operations of block 105 may include operating the DUT with the same physical test parameters (e.g., time, temperature, etc.) that were used to obtain the EL reference data, but without modifying the software/firmware of the DUT prior to performing the relevant measurements. In such instances differences between the EL test data and the reference model may be attributable to differences in the hardware and/or software/firmware of the DUT relative to the reference device/specification. By measuring the EL emissions of the DUT with both methodologies (i.e., with and without ensuring the software/firmware of the DUT is consistent with the software/firmware used in the reference design), differences between the DUT and the reference device/specification can be more specifically attributed to software variations between the DUT and the reference device/specification.

Once the EL test data is obtained the method may proceed from block 170 to block 180, pursuant to which the EL test data may be processed to produce a data structure that can be compared to the reference model. In embodiments, the operations of block 180 include processing the EL test data in the same or similar manner as the processing of EL reference data to produce the reference model. For example, where the reference model is produced by aggregating and convolving (e.g., encrypting) EL reference data, the operations of block 180 may include aggregating and convolving (e.g., encrypting) the EL test data in the same or similar manner as the operations used to produce the reference model. In embodiments where EL reference data is in the form of a reference image or a composite reference image (e.g., a stackup of reference images, the operations of block 180 may include overlaying EL test data from individual test modality on an image of the DUT to form one or more test images, and/or overlaying EL test data from a plurality of test modalities on a single image of the DUT to form a composite test image (e.g., a stackup of test images). When the EL reference data is in the form of reference images or a composite reference image that has been subjected to principal component analysis (i.e., a RPCA image), the test image(s) may likewise be subject to principal component analysis to produce TPCA image(s) that can be compared to the RPCA image(s). For ease of reference, the EL test data after processing may be referred to herein as "comparative EL test data." Alternatively, or additionally, EL test data may be individually compared to the reference model to determine to what degree it differs from corresponding elements of the reference model.

By way of example, pursuant to block 103 a reference model in the form of a signature map of EL activity of a reference device may be created. Pursuant to block 105, EL activity of corresponding portions of a DUT may be measured to obtain EL test data from the same portions of the DUT the EL reference data that was used to produce the reference model. Pursuant to block 107, the EL test data and reference model (e.g., EL reference data) may be compared using template matching or another suitable comparative method. For example, the EL test data may be arranged into a test EL signature map, test spatial profile, test timing map, etc., which can be compared to the corresponding reference signature map, special profile, and/or timing map obtained from the reference device and/or reference specification to produce a confidence indicator for a particular location of the DUT. In embodiments the confidence indicator may be a percentage score that is indicative of the degree to which the EL activity of the DUT matches the EL activity of the reference device at one or more locations, with increasing percentage indicating a greater match. Confidence indicators for multiple locations on the DUT may be arranged to form a confidence map.

Following the operations of block 107 the method may proceed to block 109, pursuant to which a determination may be made as to whether the DUT is within a reference specification. The outcome of block 107 may be determined based on a comparison of the reference model to the EL test data obtained from the device under test or, more specifically, to the comparative EL test data. If the comparison indicates that the (comparative) EL test data matches the reference model to within a desired degree of confidence (i.e., the difference between the two is less than a threshold amount), the outcome of block 109 is YES and the method may proceed to block 111, pursuant to which a report may be generated indicating that the DUT is within the reference specification. If the comparison indicates that the (comparative) EL test data differs from the reference model by more than the threshold amount, however, the outcome of block 109 is NO and the method may proceed to block 113.

EL test data may be considered to not match EL reference data based on one or a plurality of factors. For example, EL test data may be considered to not match EL reference data if one or more of its characteristics (e.g., intensity, timing, etc.) differ from the characteristics of EL activity in EL reference data in a way that cannot be explained by other factors, such as the age or use of the DUT. Similarly, EL test data may be considered to differ from EL reference data if it includes EL emissions at a location of a DUT where EL emissions are not found in a reference device. For example, if EL intensity at one point on a DUT is different from the EL intensity at a corresponding point of a reference device but the intensity is still greater than 0, that difference could be attributable to differences in the age of the DUT or environmental factors. Alternatively, if EL test data shows that EL activity is not present at one point on a DUT where is present in a reference device, the absence of EL activity may be due to the addition or removal or device function in the DUT. In such instances and pursuant to block 113 a report may be generated indicating that the DUT is out of the reference specification. In either case, the method may proceed from block 111 or block 113 to block 115 and end.

For example, and as noted above, the operations of block 107 may result in the production of a confidence map that includes confidence indicators for multiple locations on a DUT, wherein the confidence indicators indicate a degree to which EL activity of the DUT matches EL activity of a reference device at various locations. If a confidence indicator falls below a confidence threshold (e.g., below a percentage threshold such as 95%, 90%, 85%, etc.), the outcome of block 109 may be NO and the method may proceed to block 113. If all confidence indicators are above the confidence threshold, however, the outcome of block 109 may be YES and the method may proceed to block 111. Alternatively, or additionally, the outcome of block 109 may be location dependent. In such instances, reports may be generated indicating that the DUT is out of specification or within specification on a location dependent basis. For example, EL test data measured from a processor of a DUT may match EL reference data of a processor of a reference device at above the confidence threshold (e.g., greater than or equal to a 90% match), but EL test data measured from the memory of the DUT may match EL reference data of a memory of the reference device below the confidence threshold. In such instances an in specification report may be generated for the processor of the DUT, but an out of specification report may be generated for the memory of the DUT.

In embodiments and as noted above, the operations of block 103 may result in the production of a reference model in the form of one or more reference images and/or a composite reference image (e.g., a stackup image) of a reference device, and the operations of block 105 may result in the production of one or more test images and/or a composite test images (e.g., a stackup image) of a DUT. In such embodiments the operations of block 107 may involve comparing the reference images and/or composite reference image to corresponding test images and/or the composite test image. A region by region comparison can be made to determine a degree to which the activity of individual components of a DUT is similar to the activity of corresponding parts of the reference device, and a confidence score for each component may be assigned. If the confidence score for a component is below a confidence threshold for that component, an alert may be generated signifying a departure of the DUT from the reference device at that component. Alternatively, if the confidence score for a component is at or above a confidence threshold for that component, an indicator may be generated to signify that component of the DUT is consistent with the corresponding component of the reference device. In embodiments, a composite confidence score for the entire DUT may be generated based on the individual confidence scores produced for all or a subset of the components of the DUT, and/or a comparison of the activity of the DUT and the reference device as a whole. In such embodiments, the outcome of block 109 may be conditioned on whether the composite confidence score is greater than or equal to a confidence threshold for all or a subset of the device (i.e., a composite confidence threshold).

For clarity and ease of understanding, use cases of the method of FIGS. 1A-1C will now be described. In a first use case, pursuant to block 103 a reference model may be generated by measuring EL emissions from a reference device using single photon counting, SWIR imaging, and spectroscopy while the device is operated. The single photon data may be mapped to one or a plurality of single channel images that include frequency results, rise time results, and/or spectral data of the measured EL activity from the reference device. The single channel image(s) may be converted to a multichannel reference image of n channels (where n is an integer greater than or equal to 2) or a stack of reference images within n reference images, resulting in the production of a reference model. Optionally, production of a reference model may include reducing the dimensionality of the reference image(s) using machine learning techniques such as image to image conversion or principal component analysis to create one or more reduced reference images. In embodiments, the measured images may be similarly reduced to produce one or more reduced measured images. Pursuant to block 105 EL activity of a DUT may be measured and processed in the same manner used to produce the reference model. The resulting EL test data may then be compared to the reference model pursuant to block 107, and pursuant to block 109 a determination may be made whether the EL test data is within the device specification based on the comparison as discussed above. Suitable reports may then be generated pursuant to blocks 111 and 113 based on the comparison.

In second use case, pursuant to block 103 a reference device may be imaged using SWIR imaging to identify EL hotspots (regions of EL activity) on the reference device. EL timing data and/or spectroscopy data may then be obtained by measuring the EL hotspots within a single photon detector, spectrometer, or a combination thereof. The EL reference data (i.e., EL timing data, SWIR data, and/or spectroscopy data) may then be assembled into a list that correlates location coordinates on the reference device with the associated EL reference data. The EL reference data may optionally be analyzed through photon counting analysis or other suitable means to determine if EL activity at a subset of the coordinates or test modalities should be assessed on another reference device. Pursuant to block 105, EL activity of a DUT can then be measured in the same manner, with specific locations on the DUT optionally targeted. The resulting EL test data may be compared to the EL reference data. Pursuant to block 107, differences between the EL test data and the EL reference data may be determined and scored based on their meaning. For example, if EL is occurring at corresponding spots on a DUT and a reference device, but the wavelength is different, a confidence indicator may be generated that includes a relatively high counterfeit score (indicator that the device is counterfeit), but a relatively low activity difference score (indicator of difference between DUT EL activity and EL activity of the reference device). Alternatively, or additionally, if EL activity is occurring at different locations on the DUT than the reference device, but the spectrum appears similar, a confidence interval may be assigned that includes a relatively high activity difference score, but a relatively low counterfeit score. Pursuant to block 109 determinations may be made as to whether the DUT is within specification or not based on the comparison performed pursuant to block 107, and suitable reports may then be generated pursuant to blocks 111 and 113.

In a third use case, pursuant to block 103 a reference model may be generated by measuring EL activity of a reference device executing different firmware and/or software. The EL activity data may be processed in the manner noted above, e.g., into a reference EL activity map. Pursuant to block 105, EL activity of a DUT may then be performed in the same manner, to generate a test EL activity map. A differential image may then be generated by comparing the reference EL activity map to the test EL activity map. Regions of the differential image may be scored with confidence indicators that indicate a degree to which EL activity of the DUT differs from the EL activity of the reference device. Analysis may optionally be performed on the differential image to determine the basis for the different activity. Pursuant to block 109, regions with a confidence indicator that is below a confidence threshold may be considered out of specification, whereas those with a confidence indicator above a confidence threshold may be considered within specification. Suitable reports may be generated pursuant to blocks 111 and 113.

Figure 8:
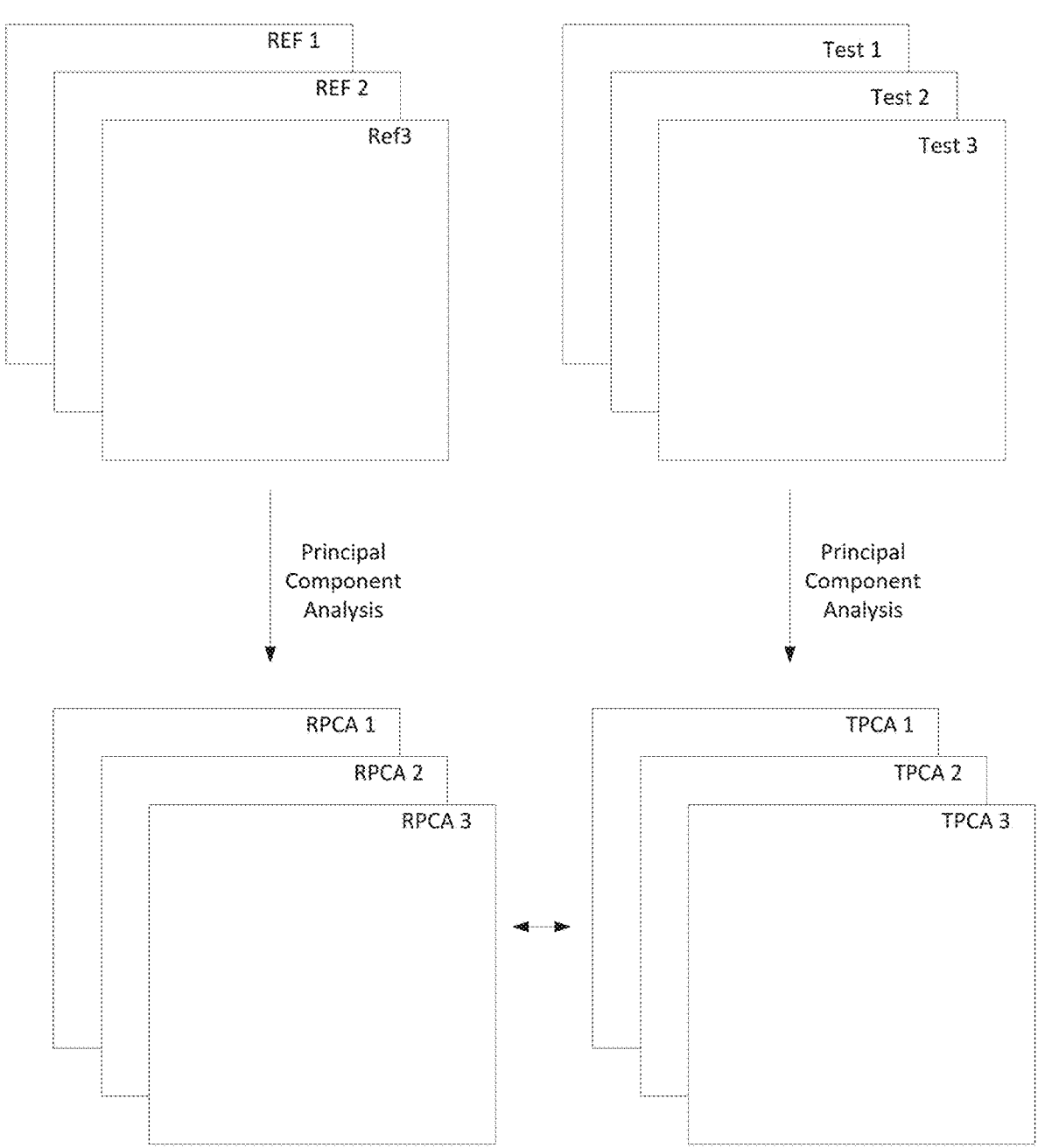
FIG. 8 depicts one example of the production of processed reference and test images using principal component analysis, consistent with the present disclosure.
Figure 9:
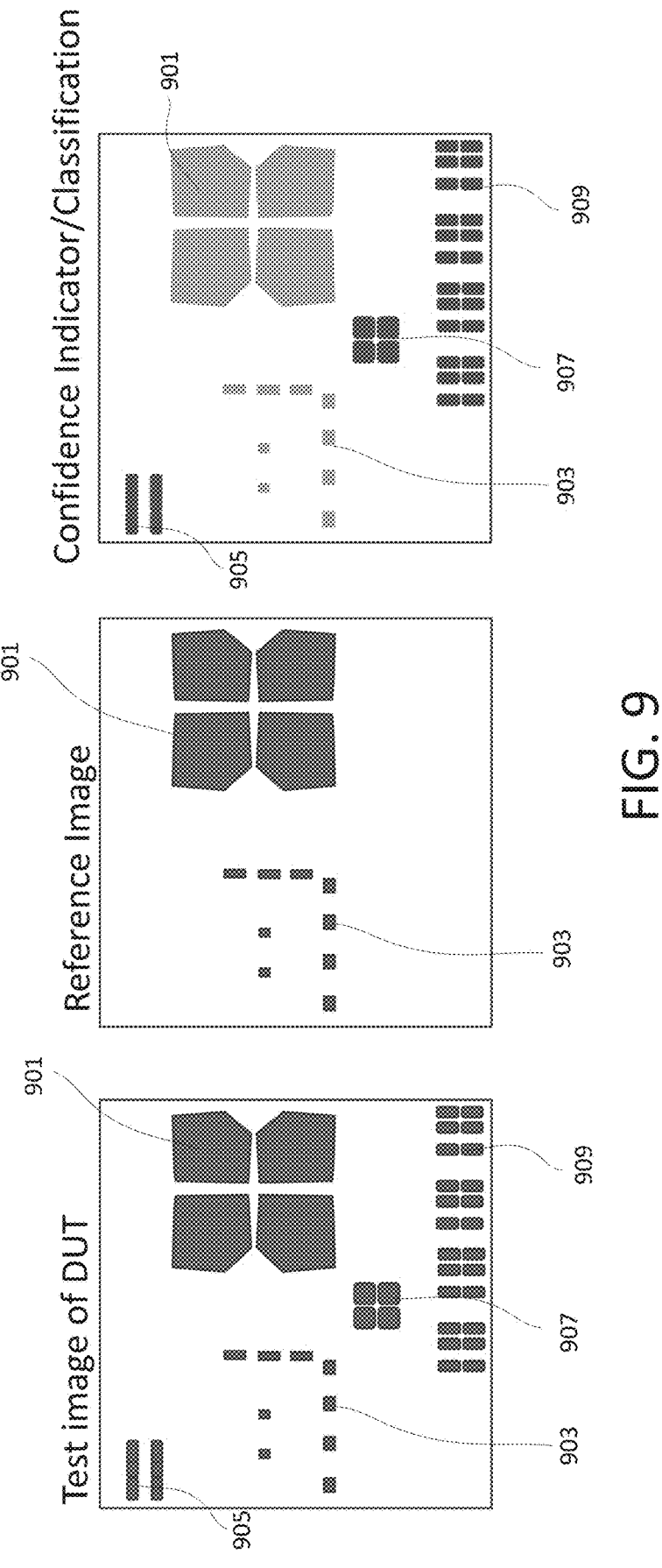
FIG. 9 depicts one example of the assignment of confidence indicators based on a comparison of a test image of a device under test and a reference image of a reference device.

In fourth use case, pursuant to block 103 a reference device may be imaged using SWIR imaging to identify EL hotspots (regions of EL activity) on different portions of the reference device. The resulting reference images may be subject to principal component analysis (PCA) to obtain a plurality of reference PCA images (i.e., RPCA images) as shown in FIG. 8. Pursuant to block 105, EL activity of a DUT can then be measured in the same manner, with specific locations on the DUT targeted to correspond to the imaged portions of the reference device. The resulting test images may then be subject to PCA analysis to produce a plurality of test PCA images (TPCA images) as shown in FIG. 8. Pursuant to block 107 the TPCA images and RPCA images may be compared (as illustrated in FIG. 8) and one or more confidence indicators may be assigned to all, or a portion of the DUT based on that comparison. For example, and as shown in FIG. 9, a reference image from a reference device may show EL activity at regions 901 and 903 of the reference device, whereas a test image obtained by imaging EL activity of a DUT indicates that the DUT exhibits EL activity at regions 901, 903, 905, 907, and 909. In such instances a first indicator (e.g., a first color) may be applied to regions 901, 903 to illustrate a high degree of similarity in EL activity between the DUT and reference device in those regions. In contrast a second indicator (e.g., a second color) may be applied to regions 905, 907, and 909 to illustrate the relatively low degree of similarity between the EL activity of the DUT and reference device in those regions. Pursuant to block 109 determinations may be made as to whether the DUT is within specification or not based on the comparison performed pursuant to block 107, and suitable reports may then be generated pursuant to blocks 111 and 113. Such a report may indicate that certain areas of a DUT are more similar to a reference device than others, as shown in FIG. 9.

In fifth use case, pursuant to block 103 the EL reference data may be used to modify the setup (such as the selection of a reduced number of bandpass filters as determine by hyperspectral EL imaging or EL spectroscopy) to reduce the image acquisition time and the number of modalities required for the comparison of DUT data. PCA or other dimension reduction techniques can be used to determine modality that result in least amount of duplicate information while maintaining high confidence results.

Figure 10:
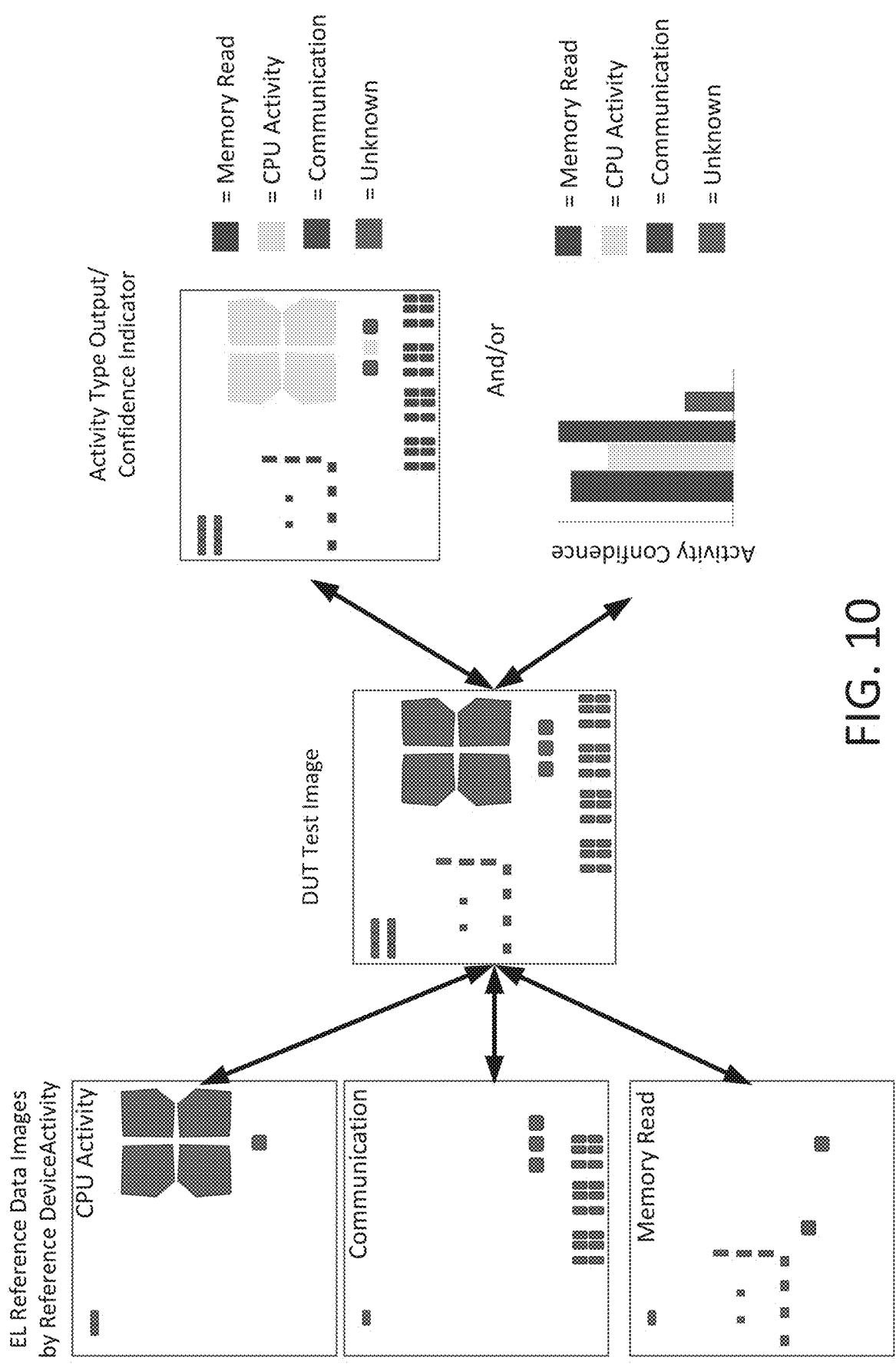
FIG. 10 depicts one example of the assignment of confidence indicators associated with activity type, based on a comparison of a test image obtained from a device under test to images of EL activity associated with CPU activity, communication activity, and memory read activity of a reference device.

FIG. 10 illustrates another example of operations that may be performed pursuant to blocks 103, 105, 107 and 109 of FIGS. 1A and 1B. In this example, pursuant to block 103 EL reference data in the form of three reference images is obtained from a reference device. The first reference image shows EL activity associated with central processing unit (CPU) activity of the reference device, the second reference image shows EL activity associated with communications activity of the reference device, and the third reference image shows EL activity associated with memory read activity of the reference device. Pursuant to block 105, EL activity of a DUT is imaged using the same techniques used to image the reference device, in this case to produce single DUT test image showing EL activity of the test device. Pursuant to block 107, the DUT test image is compared to the three reference images. Based on that comparison, confidence indicators indicative of a degree to which EL activity of the DUT is consistent with certain operations of the reference device are assigned pursuant to block 109. In embodiments and as shown in FIG. 10, different confidence indicators may be applied to indicate a degree to which EL activity in the test device is believed to correspond to CPU activity, communication activity, and/or memory read activity based on a comparison of the DUT test image and EL reference images. For example, EL activity in the DUT that corresponds highly with memory read activity may be indicated with a first confidence indicator (e.g., a first color) that is overlaid onto a corresponding portion of an image of the DUT. Likewise, EL activity in the DUT that corresponds highly with CPU activity and communication activity may be indicated with corresponding confidence indicators (e.g., second and third colors). EL activity in the DUT that does not correlate highly with EL activity of the reference device may be marked with an indicator that signifies that the origin of that activity is unknown. A plot of DUT activity confidence versus DUT activity type may also be produced to visually represent a degree to which EL activity of the test device is believed to correspond to CPU activity, communication activity, memory read activity, or other activity of the reference device, as shown in FIG. 10.

Another aspect of the present disclosure relates to systems for verification and validation of IC devices using EL. In that regard reference is made to FIG. 2, which is a block diagram of one example of a system for verification and validation consistent with the present disclosure. As shown, system 200 includes a stage 201, optics 205, detection array 207, and controller 215. Stage 201 is generally configured to support a sample 203 that is under consideration. In embodiments, stage 201 is motorized or is otherwise articulatable, such that sample 203 may be moved relative to optics 205. For example, and as will be described below, stage 201 may be a motorized stage or gantry that is repositionable under control of controller 215, such that EL measurements can be taken from one or multiple locations of sample 203. EL measurements may be taken as the stage is moved in a rasterized or other pattern, and the resulting data may be combined to provide information concerning the EL output over a larger area of the device under consideration.

Sample 203 may be an electronic device, such as but not limited to an IC device that can produce EL emissions 204 during operation, e.g., in accordance with a test protocol. Non-limiting examples of IC devices that can be used as sample 203 include computer processers, computer readable memories and associated circuitry, registers, communications circuitry (e.g., networking circuitry), interface (e.g., bus) circuitry, analog circuitry, power conversion circuitry, combination thereof, and the like. In any case, sample 203 may be an IC device that can produce EL emissions 204 while in operation, e.g., in accordance with a test protocol. For example, sample 203 may be an IC device that includes a silicon substrate, wherein EL emissions from sample 203 pass through the silicon substrate while sample 203 is in operation. In embodiments, sample 203 is a reference device, in which case system 200 may be employed to obtain EL reference data. In other embodiments sample 203 is a DUT, in which case system 200 may be used to obtain EL test data.

Optics 205 are generally configured to facilitate the conveyance and detection of light (specifically EL emissions 204) emitted from sample 203 to detection array 207. In that regard, optics 205 may include or be part of an optical train that is useful for one or more of the detection systems used in detection array. For example, optics 205 may include one or more optical objectives (e.g., microscopy objectives), mirrors, filters, beam splitters, lenses, combinations thereof, and the like, as would be understood by those of ordinary skill to be suitable for use with the relevant detection technique employed by the detection systems in detection array 207.

Figure 2:
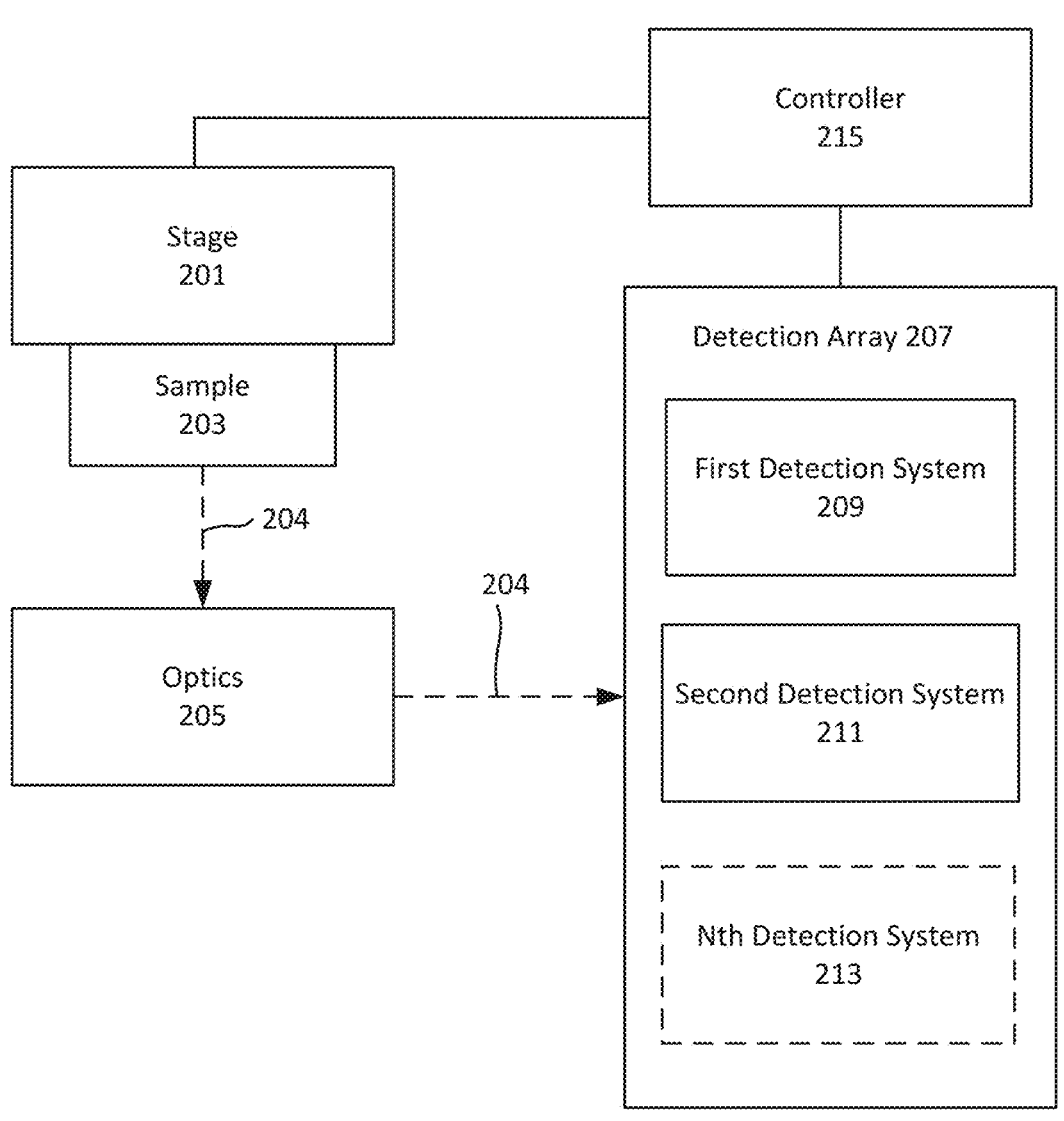
FIG. 2 is a block diagram of one example of an inspection system consistent with the present disclosure.

Detection array 207 includes one or more detection systems that can detect or otherwise measure EL emissions from one or more sides of sample 203. As shown in FIG. 2, detection array 207 may include a plurality of detection systems, such as but not limited to first detection system 209 and second detection system 211. The number of detection systems in detection array 207 is not limited to two detection systems, however, and detection array 207 may include any suitable number of detection systems. For example, detection array 207 may include a single detection system, such as a single SWIR imaging system, a single spectrometer, one single photon counting system, etc. Alternatively, in embodiments detection array 207 includes a plurality of (e.g., 2, 3, 4, more) detection systems that can detect or otherwise measure EL emissions from one or more sides of sample 203. That concept is illustrated in FIG. 2 by optional "nth detection system 213" where n is an integer greater than 2. First, second, and nth detection systems 209, 211, 213 may be any suitable detection system for detecting and/or measuring EL emissions and/or optical modulation of EL emissions from sample 203. Non-limiting examples of suitable detection systems that may be used as first, second, and nth detection systems 209, 211, 213 include imaging systems that can image EL emissions (e.g., SWIR imaging systems, visible imaging systems, hyperspectral imaging systems (e.g., SWIR/visible imaging systems that employ one or more filters to limit imaging to a specific wavelength range, SWIR/visible imaging systems that include a plurality of cameras that are sensitive to different wavelengths of light (e.g., RGB visible light cameras, cameras sensitive to different regions of the IR spectrum, etc.))), spectrometers (e.g., ultraviolet, visible, and/or infrared spectrometers), timing systems that can measure the timing of EL emissions from a device under consideration (e.g., single photon counting detectors, time resolved single photon counting detectors), combinations thereof, and the like. Such systems may be configured to measure/detect EL emissions over a defined time-period and to present such emissions individually or as an aggregate. Such systems may also be configured to measure/detect EL emissions from one or a plurality of locations of sample 203. Without limitation and as will be described in further detail below, in embodiments detection array may include at least a first detection system 209 and a second detection system 211, wherein first detection system 209 is a SWIR camera, and second detection timing system that can measure timing of EL emissions from sample 203, such as a single photon counting detector, or a time resolved single photon counting detector.

System 200 further includes a controller 215. In general, the controllers described herein are configured to control the performance of verification and validation operations consistent with the present disclosure. Such operations may include obtaining measured EL reference data by measuring a reference device with detection array 207, generating simulated EL reference data from a reference design, producing a reference model from the measured and/or simulated EL reference data, obtaining EL test data by measuring a DUT with detection array 207, processing the EL test data to produce comparative EL test data, and comparing the (comparative) EL test data to the reference model to determine whether the DUT is within a reference specification. As will be described in detail later, the controllers may include a trust analysis module (TAM) that is configured to compare EL test data (or an aggregate and/or convolution thereof) to the reference model to determine whether a DUT is within a reference specification. For example, controller 215 may determine a confidence indicator that is indicative of a degree to which controller 215 believes that DUT matches a reference design/specification.

Figure 3:
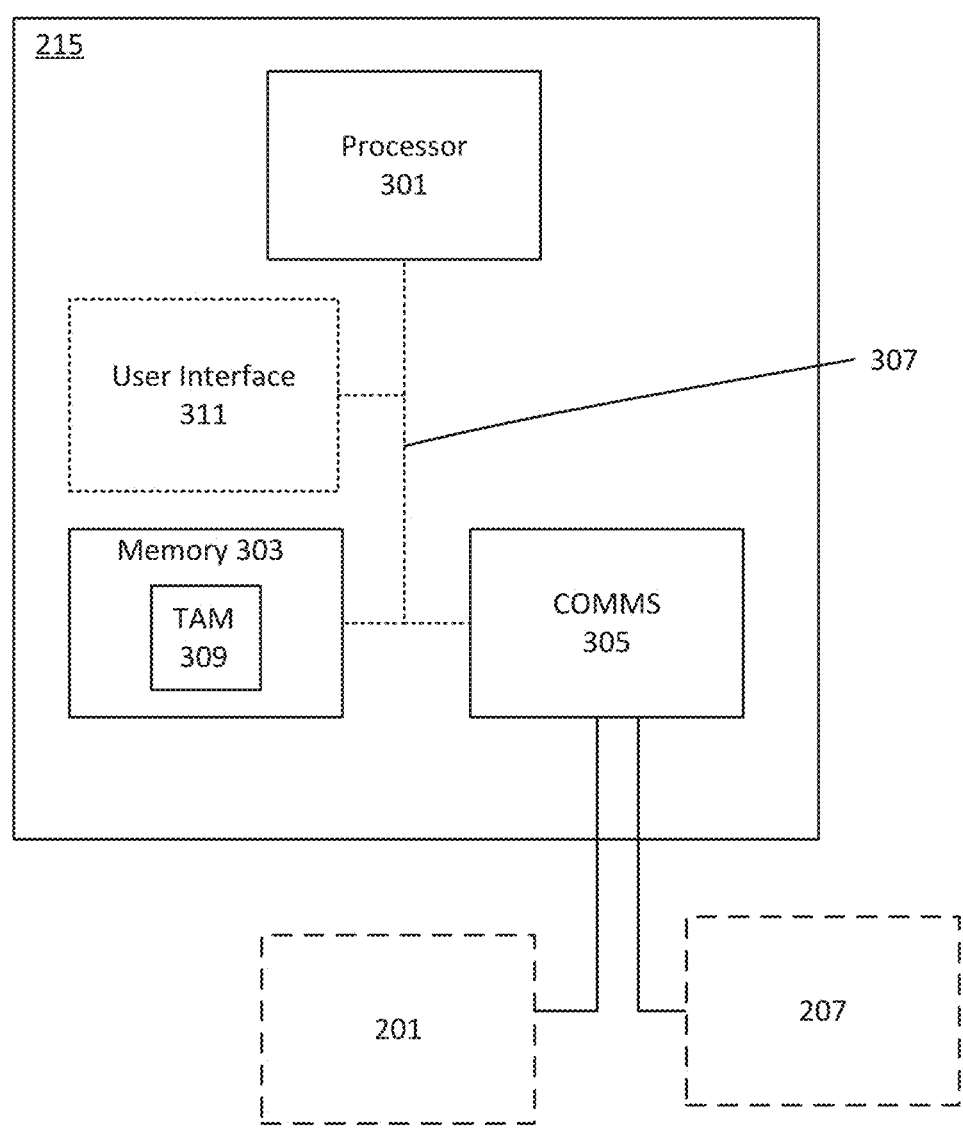
FIG. 3 is a block diagram of one example of an inspection controller consistent with the present disclosure.

Reference is now made to FIG. 3, which is a block diagram illustrating one example of a controller 215 that may be used in accordance with the present disclosure. As shown, controller 215 includes a processor 301, memory 303, communications circuitry (COMMS) 305, and an optional user interface 311. Such components may be communicatively coupled to one another in any suitable manner, such as via a bus 307.

Processor 301 may be any suitable general-purpose processor, field programmable gate array (FPGA) or application specific integrated circuit. Without limitation, in embodiments processor 301 is one or more single or multicore processors produced by INTEL® corporation, APPLE® corporation, AMD® corporation SAMSUNG® corporation, NVIDIA® corporation, Advanced RISC Machines (ARM®) corporation, combinations thereof, or the like. Alternatively, or additionally, processor 301 is or includes an FPGA or FPGA system on a chip that includes both a digital logic component and processing component. While FIG. 3 depicts the use of a single processor 301, multiple (2, 3, 4, etc.) processors can be used.

Memory 303 may be any suitable type of computer readable memory. Examples of memory types that may be used as memory 303 include but are not limited to: programmable memory, non-volatile memory, read only memory, electronically programmable memory, random access memory, flash memory (which may include, for example NAND or NOR type memory structures), magnetic disk memory, optical disk memory, phase change memory, memristor memory technology, spin torque transfer memory, combinations thereof, and the like. Additionally, or alternatively, memory 303 may include other and/or later-developed types of computer-readable memory.

COMMS 305 may include hardware (i.e., circuitry), software, or a combination of hardware and software that is configured to allow controller 215 to transmit and receive messages via wired and/or wireless communication to/from one or more devices, such as but not limited to stage 201 and detection array 207 (including one or more detection systems thereof). Communication between COMMS 305, stage 201, and detection array 207 may occur, for example, via a wired or wireless connection using one or more currently known or future developed communication standards. COMMS 305 may include hardware to support such communication, e.g., one or more transponders, antennas, Bluetooth® chips, personal area network chips, near field communication chips, wired and/or wireless network interface circuitry, combinations thereof, and the like.

Optional user interface 311, when used, is configured to provide a mechanism for a user to interact with and configure controller 215 and/or one or more components thereof. Any suitable user interface may be used as user interface 311. For example, user interface 311 may be or include a mechanical user interface, a graphical user interface, or a combination thereof.

Controller 215 further includes a trust analysis module (TAM) 309. In this specific context, the term "module" refers to software, firmware, circuitry, and/or combinations thereof that is/are configured to perform or cause the performance of one or more operations consistent with the present disclosure. Software may be embodied as a software package, code, instructions, instruction sets and/or data recorded on non-transitory computer readable storage mediums. Firmware may be embodied as code, instructions or instruction sets and/or data that are hard-coded (e.g., non-volatile) in controller 215, e.g., within memory 303 (as shown in FIG. 3) or other computer readable storage. In embodiments, TAM 309 is in the form of logic that is implemented at least in part in hardware to perform device verification and validation operations consistent with the present disclosure. For example, TAM 309 may be in the form of computer readable instructions which when executed by processor 301 cause controller 215 to perform device verification and validation operations consistent with the present disclosure, such as but not limited to all or a subset of the operations of the method of FIGS. 1A-1C described herein.

Different foundries and IC manufacturing processes produce IC devices that have different device geometries, channel types, and other characteristics, any, or all of which can impact the EL output of a device. Additionally, defects/ traps produced within the device by the processes employed by a foundry can impact the EL emission of an IC and cause it to produce a unique EL emissions signal. Software and/or firmware executing on an IC can also impact EL emissions produced by the IC. By combining EL data from different measurement modalities (e.g., EL imaging, EL spectroscopy, EL timing, etc.), a reference model that includes or is in the form of a unique signature or "fingerprint" of the IC can be made. The signature or fingerprint provided in the reference model can be further enhanced by focusing on EL emissions from specific locations of an IC device, such as memory cells, transistors, power circuitry, communications circuitry, etc. and combinations thereof.

With the foregoing in mind, in embodiments the verification and validation operations (e.g., the operations of one or more blocks of FIGS. 1A, such as block 107) may include determining whether one or more physical features of a DUT corresponds to one or more physical features of a reference device/design. For example, EL emissions produced at a particular location of a reference device/design may be associated with materials and/or structures of the reference device/design at that location. For example, the materials and structure of a DUT and/or reference device may result in the production of EL emissions with a specified timing, wavelength, intensity, decay, etc., in response to an applied stimulus (e.g., operation of the IC under specific test conditions and/or with specific software/firmware). With that in mind, EL test data (e.g., SWIR images, infrared/ visible spectra, single photon counting data, etc.) obtained from a corresponding location of a DUT can be compared to EL reference data (e.g., SWIR images, spectra, single photon counting data, etc.) from that location in the reference design/device when the DUT and the reference device/ design are subject to the same test methodology (e.g., the same stimulus). If the EL test data (or comparative EL test data) at that location differs from the EL reference data (or reference model) at that location by less than a threshold amount, an inference may be made that the materials and/or structures at that location in the DUT match the materials and/or structures of the reference design. If the difference between the EL test data (or comparative EL test data) at that location differs from the EL reference data (or reference model) at that location by greater than a threshold amount, however, an inference may be made that the materials and/or structures at that location in the DUT do not match the materials and/or structures of the reference design.

The verification and validation operations may also include measuring EL emissions at a first location and a second locations on a DUT, determining a first relationship between such emissions (e.g., the position of EL emissions relative to each other, timing of EL emissions relative to each other at the first and second locations), and comparing the first relationship between the EL emissions detected from the DUT at the first and second locations to a second reference relationship between measured/simulated EL reference data from corresponding locations on a reference device/design. The measurement of the EL emissions at the first and second locations may be performed in any suitable manner, such as via SWIR imaging, single photon counting, spectroscopy, etc. as noted above. If the first relationship differs from the second relationship by less than or equal to a threshold amount when the DUT and reference device are subject to the same stimulus, a determination may be made that the DUT is in accordance with the reference device/ design at the first and second locations. If the first relationship differs from the second relationship by greater than the threshold amount, however, a determination may be made that the DUT is outside the reference device/design at one or both the first and second locations.

The verification and validation operations may also include determining whether logic in hardware, firmware, or software in a DUT has been changed relative to a reference design. Such operations may include developing a reference model based EL emissions of a reference device and/or a reference design that includes known good hardware, firmware, and software. The operations may further include performing first measurements in which the EL activity of a DUT is measured as it is operated in the same manner as the reference design, but without modifying the software thereon. EL activity of the DUT may be measured in any suitable manner, such as by EL imaging (e.g., SWIR imaging), aggregated or individual EL timing measurements (e.g., with single photon detection or time resolved single photon detection), EL spectroscopy measurements (e.g., with ultraviolet, visible, or infrared spectroscopy), combinations thereof, and the like. The resulting EL test data may then be compared (optionally after processing) to a reference model produced from EL reference data obtained from a reference device/design. Because software/firmware executing on an IC impacts its EL activity, comparison of the EL activity of the DUT to EL activity of the reference device can reveal whether software/firmware on the DUT is consistent with software/firmware of the reference device. The impact of the software executing on the DUT can be further validated by performing second measurements on the DUT, wherein the second measurements are the same as the first measurements but are performed after the software/firmware on the DUT is replaced with the software/firmware that is known to be running on the reference device. If the EL test data (optionally after processing) obtained by the second measurements matches the reference model within the confidence indicator following replacement of the software/ firmware on the DUT, a determination may be made that the differences between the EL output of the DUT obtained during the first measurements are attributable to differences in software and/or firmware between the DUT and the reference device. If the EL test data obtained by the second measurements still does not match the reference model within the confidence indicator, however, a determination may be made that there are differences between the physical structure of the DUT and the physical structure of the reference device.

The verification and validation operations may also include determining whether the age of a DUT is consistent with a reference specification. In that regard it is noted that as an IC is used over time, additional traps are created in the oxide of the IC. Such traps can create a detectable change in the timing of EL emissions from an IC or portions thereof, such as but not limited to memory and transistors. Such traps may also potentially create other detectable changes, such as changes in the wavelength of EL emissions from a device. With that in mind, in embodiments the verification and validation operations include producing a reference model of a reference device of a known age (e.g., a new or unused device) from simulated or measure EL reference data, measuring EL test data from a DUT of unknown age, and comparing the EL test data (optionally after processing). If the comparison reveals that the timing or other characteristics of EL emissions of the DUT differs from the corresponding timing/other characteristics of EL emissions of the reference device/design, a determination may be made that the DUT is a used device. Depending on the nature of the changes involved, it may also be possible to determine how long the DUT has been used, e.g., by comparing EL test data with a reference model that includes EL reference data obtained from a reference device at different time periods, e.g., when the reference device is new, when it has been used for a first period of time (e.g., a first number of hours), when it has been used for a second period of time (e.g., a second number of hours), etc.

The above discussion has generally discussed EL measurements in the context of measurements of an IC device. Although such measurements are useful, due to the weak nature of EL emissions it may be pragmatically difficult to detect EL emissions with a detector that focuses on a relatively large area of a reference device or DUT. Consequently, it may be desirable to measure EL emissions from specific area of a reference design or DUT and then integrate the measured EL emissions to obtain a map of EL emissions of a larger area of the device. For example, EL measurements may involve focusing optics 205 on a first (small) area of sample 203 (a DUT or reference device) and operating sample 203 in accordance with a test methodology to record EL activity at the first location with detection array 207. After measurements are complete on the first area, stage 201 may be articulated to reposition sample 203 relative to optics 205, such that optics 205 focus on a second (relatively small) area of sample 203. Sample 203 may then be operated again in accordance with the test methodology, during which detection array 207 is used to measure EL activity at the second location. This process may repeat for any desired number of iterations (e.g., by rasterizing sample 203 relative to optics 205) until the EL activity of all or a desired area of sample 203 has been measured by detection array 207. The data obtained by each iterative measurement may be used individually as or in a reference model, or they may be aggregated and/or convolved as discussed above to produce a reference model as discussed above. In either case, EL test data is produced that can be compared to the reference model to perform verification and validation operations as discussed above.

Figure 4:
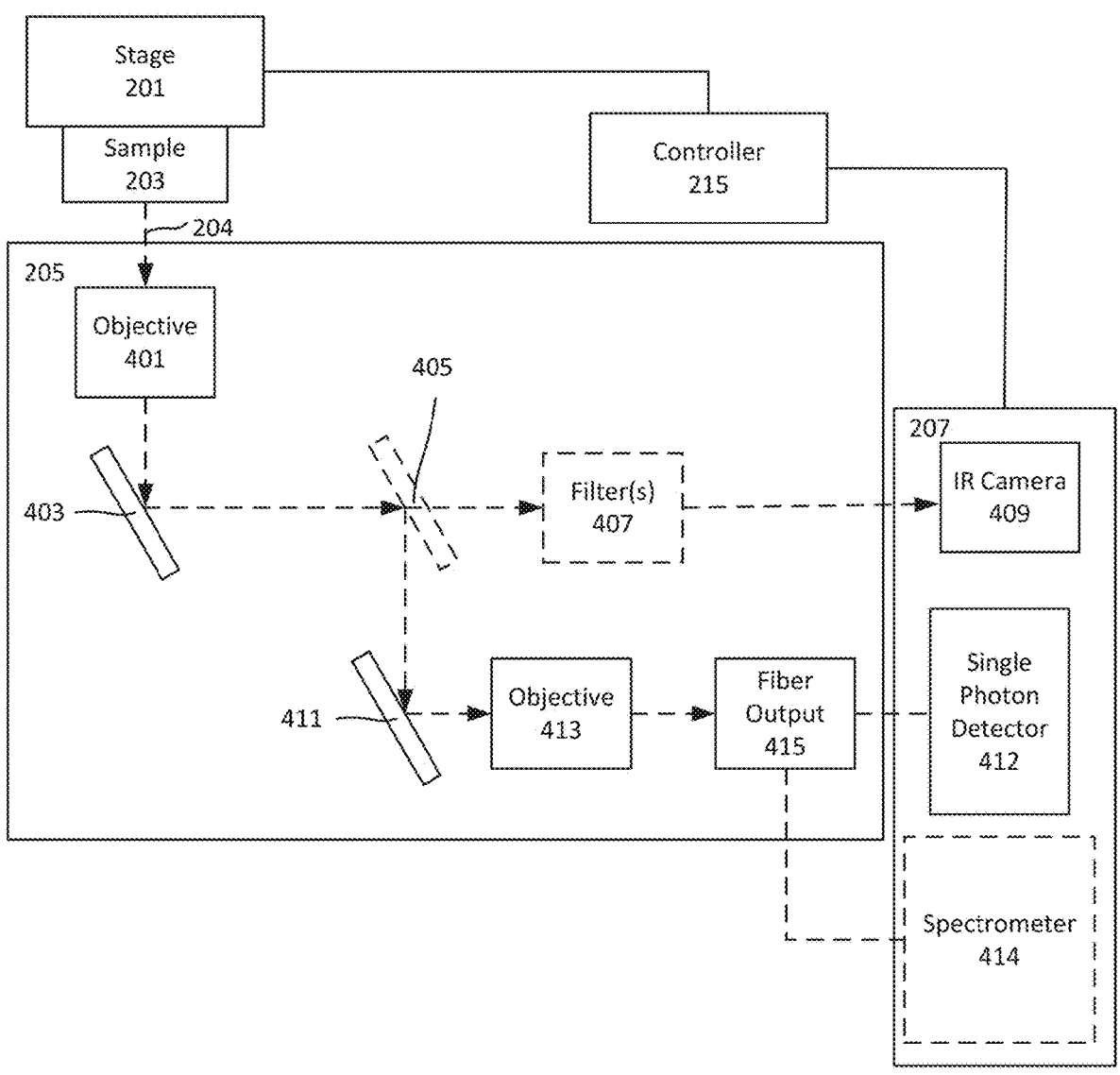
FIG. 4 is a block diagram of another example of an inspection system consistent with the present disclosure.

FIG. 4 is another example of a system for verification and validation of integrated circuits consistent with the present disclosure. As shown, system 400 includes a stage 201, sample 203, optics 205, and controller 215. The nature and function of stage 201, sample 203, and controller 215 is the same as described above in connection with FIGS. 2 and 3 and so is not reiterated in the interest of brevity. In this embodiment, optics 205 is an optical train that is configured to convey the EL output (i.e., EL emissions 204) of sample 203 to multiple different detection systems within detection array 207. In that regard, optics 205 includes a first objective 401, first mirror 403, an optional second mirror 405, optional filters 407, a third mirror 411, and a second objective 413. First objective 401 may be a microscope or other suitable objective that is configured to receive EL emissions 204 from sample 203 and direct them to first mirror 403. First mirror 403 redirects EL emissions 204 towards downstream components of optics 205.

Figure 5:
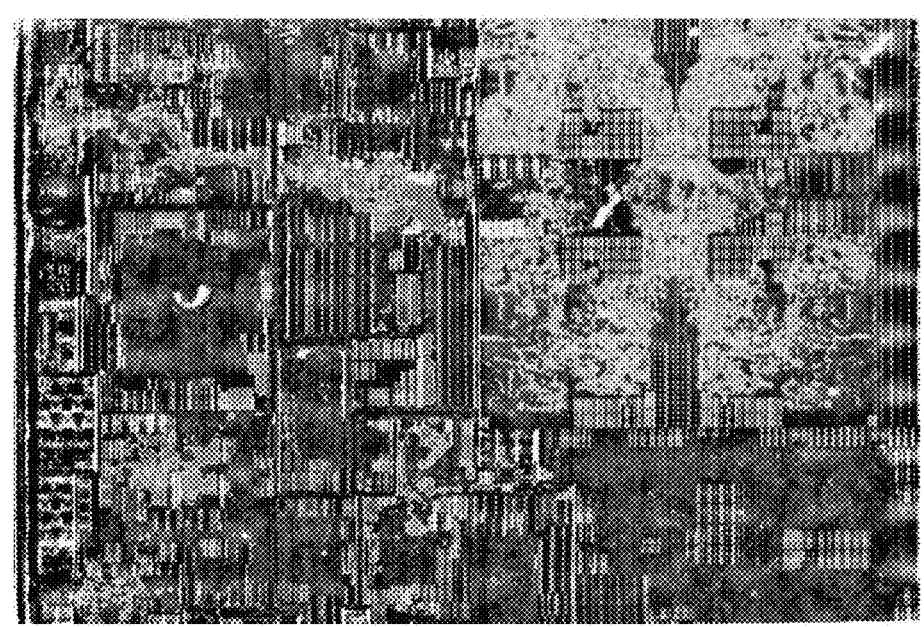
FIG. 5 is an electroluminescent heat map of an integrated circuit device overlayed on an illuminated image of the device
Figure 6:
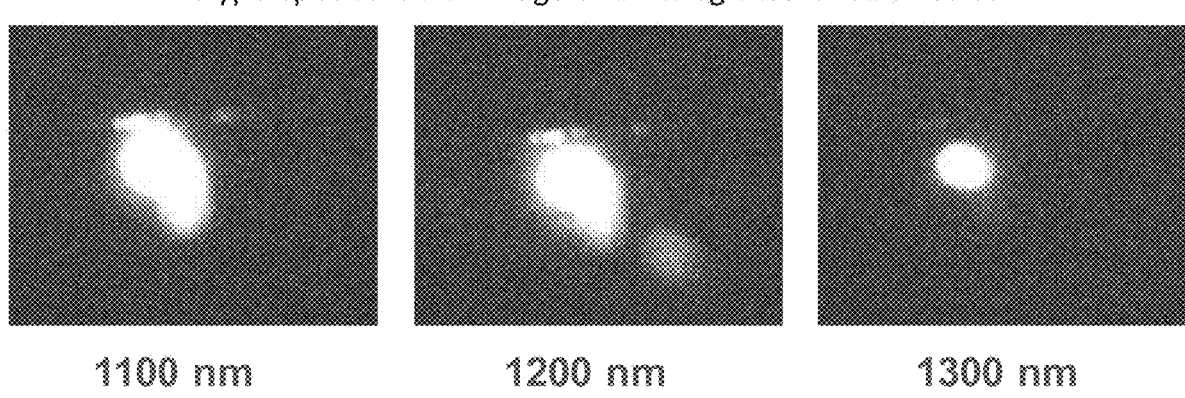
FIG. 6 depicts EL images of a driver on an integrated circuit device taken with different bandpass filters.

When optional second mirror 405 is omitted (or is present but articulated out of the optical path of EL emissions 204), EL emissions 204 may be directed from first mirror 403 to optional filters 407. Filters 407, when used, may be optical (e.g., bandgap) filters that black transmission of EL emissions that are outside of one or more defined wavelength ranges. Such filters may be used, for example, when hyperspectral imaging is to be employed in the evaluation of sample 203. In any case, all, or a portion of EL emissions 204 may pass through filter(s) 407 and be directed to an infrared (IR) camera 409 of detection array 207. In embodiments, IR camera 409 is an SWIR camera that is sensitive to near infrared light (e.g., light having a wavelength in the range of 900 to 1700 nanometers (nm)), and particularly to IR light that can transmit through silicon used in sample 203. In embodiments, IR camera 409 is a high quantum efficiency, cooled gas array (e.g., a cooled InGaAs array) near infrared camera that is sensitive to light in a wavelength range of 900 to 1700 nm. In any case, IR camera 409 may be configured to produce one or more SWIR images of sample 203 based on detected EL emissions 204. FIG. 5 is an electroluminescent heat map of an integrated circuit device overlayed on an illuminated image of the device, wherein the heat map was produced by measuring EL emissions 204 of sample 203 (in this case, a microprocessor) as stage 201 moves sample 203 relative to first objective 401. As may be appreciated, such images may be used to provide a spatially resolved metric of EL activity of sample 203. FIG. 6 depicts one example of hyperspectral images obtained by filtering the EL emissions 204 from a driver of an IC device on sample 203 with a filter 407 prior to measuring the EL emissions 204 with IR camera 409. As may be appreciated, hyperspectral images may be used to quantify the voltages of components of sample 203 and structures thereof (e.g., transistors such as metal oxide field effect transistors), and may also be indicative of materials, doping levels, structures, etc. in sample 203.

When second mirror 405 is present and/or articulated into the optical path of EL emissions 204), it may redirect EL emissions 204 from sample 203 to third mirror 411. Third mirror 411 may redirect emissions 204 into second objective 413, which in turn is optically coupled to a fiber output 415. Any suitable objective may be used as second objective 413, and any suitable fiber output may be used as fiber output 415. In embodiments the second objective 413 is or includes a lens, and fiber output 415 is or includes a fiber optic cable.

One advantage of fiber output 415 is that it may optically couple to the input of a variety of different instruments that can detect or measure EL emissions. For example, fiber output 415 may be optically coupled to the input of a timing system that can measure and analyze the timing of EL emissions, such as a single photon detector 412. In embodiments, single photon detector 412 is a time correlated single photon detector that is configured to measure the timing of EL emissions 204 that are output from sample 203, relative to a reference point. For example, single photon detector 412 may be a time correlated single photon detector. In embodiments the time correlated single photon counter includes at least two single photon counters, one on each of two channels. A first photon arriving at one of the detectors may be used as a trigger signal for the beginning of a measurement, as opposed to a separate trigger signal provided by the device or another triggering system. By using a photon from an EL emission as a trigger signal, information can be inferred about operation of the sample under consideration without the need for a hardware trigger. In any case, the time correlated single photon counting system may determine the time between the arrival of a photon at a first channel relative to the time at which a photon arrives at a second channel. The timing data obtained can be used to monitor and/or determine activity of the sample under consideration. The inventors have recognized that this can provide advantages as the relative timing of the EL emissions 204 of sample 203 relative to the first photon detected by single photon detector can provide a unique signature that is indicative of the sample 203 under consideration.

Figure 7A:
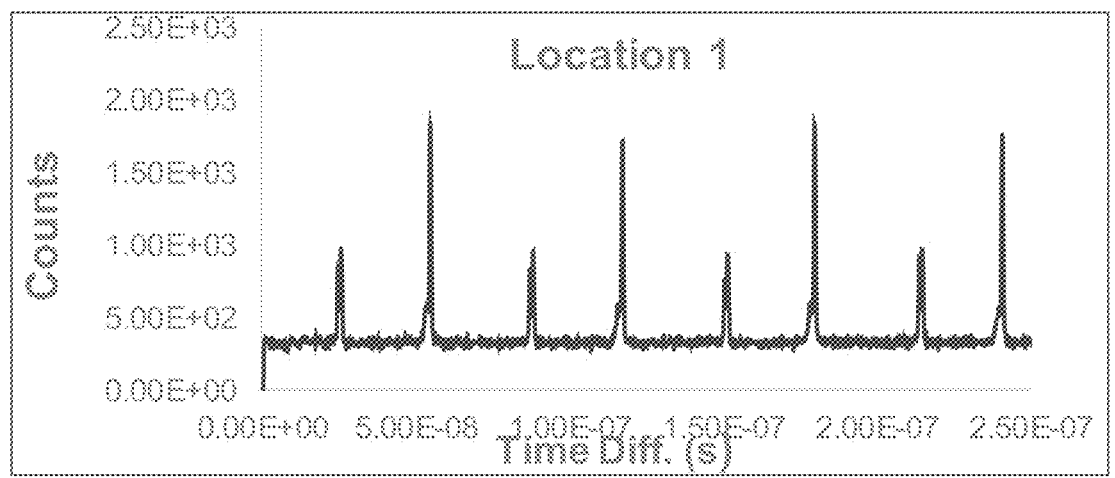
FIG. 7A is a single photon counting spectrum of a single location on an integrated circuit device.
Figure 7B:
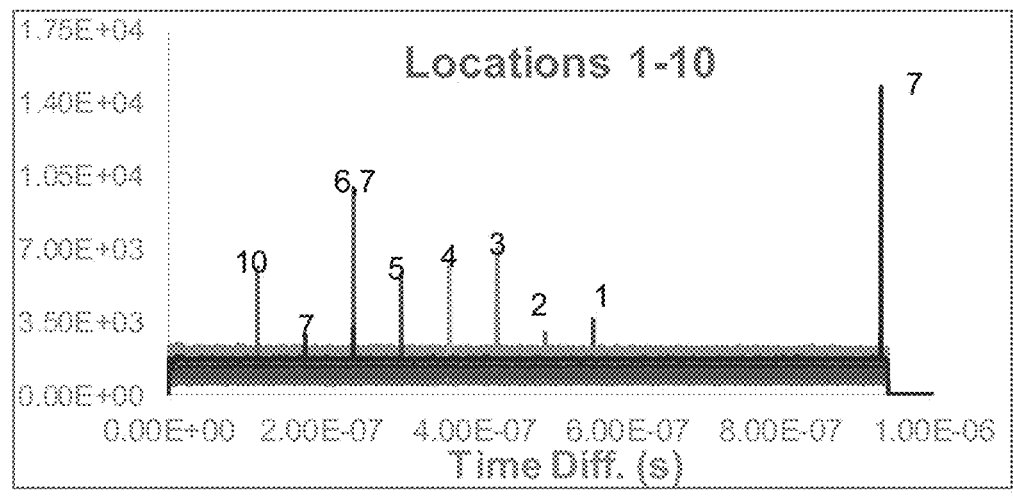
FIG. 7B is an aggregate single photon spectrum including single photon spectra taken from multiple locations on an integrated circuit device.

FIG. 7A is a plot of timing data obtained with a time correlated single photon counter on a single location of a reference device or as DUT. As shown, the time correlated spectrum records the number and timing of detected EL emissions relative to a reference time, which may be a first photon received by the system. FIG. 7B is an aggregated timing spectrum that combines timing and intensity data obtained from measuring the timing of EL emissions from multiple locations on a reference device or DUT. Timing data from a single location (FIG. 7A) may be used to understand clock and switching activity at that particular location of the reference device or DUT. Timing data obtained by counting and aggregating EL emissions from multiple locations of a refence device or a DUT can be used as or form part of a unique signature of the reference device or DUT, similar to SWIR images, spectra, etc., obtained from such devices. Moreover, timing data may be analyzed to determine various characteristics of the sample under consideration. For example, the rise/fall time of timing data can give insights into the operation of the sample, such as capacitance, current drive, and/or jitter at one or more locations. The decay rate of the falling edge of the timing peaks can also provide information about carrier dynamics of the sample. The timing data may be used individually or combined with other EL data (e.g., SWIR images, hyperspectral images, spectra) to generate an even more unique signature of the device.

To perform time correlated single photon counting, sample 203 may be moved relative to objective 401 as sample 203 is operated/stimulated. SWIR imaging may be performed with IR camera 409 to determine EL hotspots on the sample 203. Stage 201 may be moved to center EL hotspots of sample 203 relative to objective 401. EL emissions 204 from each hotspot of sample 203 are directed to a time correlated single photon detector including at least a first channel and a second channel. The EL emissions 204 may be directed to the two channels via a beam splitter (not shown). Arrival of a first photon at channel 1 may be used as the start input of the timing box of the time correlated single photon detector, and the measurement at a particular location and EL emissions arriving at channel 2 being the end input to the timing box. Timing data (i.e., the time difference between EL emissions arriving at channel 1 and 2 may be recorded over the course of the measurement. When the measurement is completed at a first location (hotspot) on sample 203, stage 201 may move sample 203 relative to objective 401 to center another hotspot relative to objective 401. The measurement may then repeat. This process may continue until all desired areas of sample 203 are measured (e.g., all EL hotspots as measured by SWIR imaging). The timing box of the single photon counting system may be used to create a histogram of the EL emissions 204.

Alternatively, or additionally, fiber output 415 may be optically coupled to the input of other instrumentation in detection array 207. For example, in embodiments detection array 207 includes a spectrometer 414, such as but not limited to an infrared spectrometer, an ultraviolet/visible spectrometer, or a combination thereof. Spectrometer 414 may be configured to obtain spectral data (e.g., wavelength, intensity, etc.) of EL emissions 204, as such information can also be used to determine information about sample 203.

As noted above re: FIG. 2, other types of detection systems may be used to measure EL emissions from a sample 203. For example, systems 200, 400 may be configured to perform illuminance imaging on a sample 203. Illuminance imaging generally involves illuminating a portion of sample 203 with a stimulating light (e.g., a laser), and measuring the EL emissions that are produced by the sample 203 in response to the illumination. Reflectance and emittance signatures responsive to the illumination may also be used to characterize the materials and/or characteristics of sample 203.

Like the apparatus of FIG. 2, due to the weak nature of EL emissions it may be pragmatically difficult to detect EL emissions from sample 203 if system 400 focuses on a relatively large area of sample 203 (i.e., a reference device or DUT). With that in mind, objective 401 may be a microscope or other suitable objective that is configured to focus on a relatively small area of sample 203. EL emissions 204 from a portion of sample 203 under consideration is directed to detection array 207 for analysis as discussed above. Stage 201 may then be moved to reposition sample 203 relative to objective 401, thereby bringing a different portion of sample 203 under analysis. The measurement may then repeat. That process may be iteratively performed (e.g., at the direction of controller 215) as sample 203 is moved in a rasterized or other pattern relative to objective 401. The resulting data may then be integrated or "stitched" together to obtain a map of EL emissions from a larger area of sample 203. Depending on whether sample 203 is a reference device or a DUT, the resulting measured EL data may be used to generate a reference model or comparative EL test data for trust and verification purposes.

Consistent with the discussion above concerning FIGS. 2 and 3, controller 215 is configured to control the operation of system 400 in the performance of trust and verification operations. Such operations may include generating a reference model, obtaining comparative EL test data from a DUT, and comparing the comparative EL test data to the reference model, and determining whether the DUT is consistent with the reference model within a confidence threshold based at least in part on that comparison. For example, in embodiments system 400 may be used to measure EL emissions of a reference device using IR camera 409 to obtain SWIR images, hyperspectral images, or a combination thereof. System 400 may also measure the timing of EL emissions from the reference device using single photon detector 412. Optionally, system 400 may also obtain spectra (e.g., ultraviolet, visible, and/or IR spectra) of the EL emissions from the reference device with spectrometer 414. The measured EL reference data obtained with detection array 207 (i.e., the IR images, hyperspectral images, timing information, spectra) may be used by controller 215 to generate a reference model of the reference device, either alone or in combination with simulated EL reference data.

System 400 may then be used to analyze a device under test (DUT) to produce measured EL test data for comparison to the reference model. As discussed above, analysis of the DUT may be performed by measuring EL emissions from the DUT as it is operated in the same or similar manner as the reference device (or under the same conditions applied to generate simulated EL reference data). For example, when EL emissions from the reference device were measured with SWIR imaging and time correlated single photon counting analysis, EL emissions from the DUT may be measured using the same techniques. In any event, controller 215 may collect the measured EL test data from the DUT and use it to determine whether the DUT is consistent with the reference model. In embodiments, that determination includes or involves comparing the measured (and unprocessed) EL test data to the reference model. In those or other embodiments the comparison involves processing the measured EL test data to obtain comparative EL test data and comprising the comparing EL test data to the reference model. For example, when the reference model is produced by convolving (e.g., encrypting) measured and/or simulated EL reference data from multiple different test modes, controller 215 may produce comparative EL test data by processing the measured EL test data in the same manner as was applied to produce to reference model. Controller 215 may then determine whether the DUT is consistent with the reference model as discussed above.

Controller 215 may also perform signal processing on the measured EL reference and/or test data for trust and verification purposes. For example, controller 215 may use signature analysis methods such as a Fast Fourier Transform (FFT) to create a multidimensional local signature of a reference device or a DUT. Similarly, controller 215 may create image slices of the EL activity of a reference device or a DUT, wherein each image slice includes a local EL signature of the reference device or DUT across a particular region of the device. Controller 215 may also use the measured EL reference and/or test data to determine spatial relationships of EL signatures of such devices. Any of these processed data sets may be compared for trust and verification purposes, e.g., by providing signatures for reference devices and DUTs that can be meaningfully compared to one another to determine if a DUT is consistent with a reference device.

As one example of the trust and verification technologies described herein, in embodiments system 400 may be used to map the optical EL waveform of EL emissions across a reference device and a device under test using a combination of SWIR imaging and correlational single photon counting as described above. The resulting data (i.e., the timing waveforms from the reference device and DUT) may be processed using an FFT to determine the frequency components thereof. Using the frequency components, the clock frequency of the reference device and the DUT may be identified by identifying the most common periodic frequency in the frequency components of the waveform. The clock frequency of the DUT and the clock frequency of the reference device may then be compared to determine whether the DUT is operating with a clock frequency that is consistent with the reference device. Similarly, SWIR imaging may be performed on the reference device and the DUT to determine the location of EL hotspots, e.g., locations at which there is EL that has a relatively strong signal. Time correlated single photon counting may then be performed at those EL hotspots as discussed above. The relative location of the EL hotpots of the DUT and may be compared to the relative location of EL hotspots on the reference device to determine to what degree the DUT and reference device are consistent. The time waveforms obtained from the DUT and the reference device may also be compared to determine if the DUT is consistent with the reference device. For example, the time waveforms obtained from the DUT and the reference device may be compared using a template approach to determine their similarity.

Put more generally, EL from the DUT and a reference device (or reference specification) may be used to characterize the activity and/or materials thereof. An EL signature of the DUT and the reference device/design may be modeled based on the obtained data, e.g., based on EL information obtained from switching or other events within the devices under consideration. The EL signature (model) may be produced from multiple aspects of the EL activity of the device, e.g., timing, relative amplitude, spectrum, etc.) as the device is operated in accordance with a test methodology. The EL signature of the reference device (reference model) may be used for verification and validation operations by comparing it to a corresponding model/signature of the EL activity of a DUT (i.e., to comparative EL test data).

As may be appreciated from the foregoing, the technologies described herein can leverage EL emissions produced by a reference device and a device under test for trust and verification purposes. For example, measured and synthetic EL reference data can be used to provide a reference model that is a fingerprint or unique signature of all or a portion of a reference device/design. The reference model may be compared to measured EL test data from a DUT for various trust and verification purposes. For example, comparison of the measured EL test data to the reference model may be performed to determine whether logic in hardware or firmware of a DUT differs from logic in hardware or firmware of a reference device. Such comparison may also be performed to determine what activity is occurring on a DUT or specific modules thereof, e.g., processor, memory access, communications circuitry, etc. Still further, such comparison may be made to verify the material and device properties of a DUT relative to a reference model/device. For example, measured EL test data may be used to extract device operations such as memory read and write actions, processor usage, power management, temperature, etc., which can then be compared to corresponding properties of a reference device via a reference model. Measure EL test data may also be compared to a reference model to confirm that the DUT is not counterfeit, e.g., by confirming proper device operation, age, materials, combinations thereof, and the like.

According to one aspect of the disclosure there is thus provided a system for inspecting integrated circuits, the system including: at least one first detection system for measuring electroluminescent (EL) images from a device under test (DUT); at least one second detection system for measuring a second measurement from the DUT; and a controller. The controller is configured to: measure EL emissions from the DUT with the at least one first detection system and the at least one second detection system to obtain a first EL test data and a second EL test data; compare the first EL test data and the second EL test data to a reference model of a reference device, the reference model developed based at least in part on measured EL reference data, synthetic EL reference data, or a combination thereof obtained from the reference device or a reference design of the reference device; and determine whether the DUT is in accordance with the reference device, or a reference specification of the reference device, based at least in part on the comparison of the first EL test data and the second EL test data to the reference model the reference device.

According to another aspect of the disclosure there is thus provided a method of inspecting integrated circuits with a controller, including obtaining a first electroluminescent (EL) test data of a device under test (DUT) at least in part by measuring EL emissions from the DUT using at least one first detection system; obtaining a second EL test data of the DUT at least in part by measuring the EL emissions from the DUT using at least one second detection system; comparing the first EL test data and the second EL test data to a reference model of a reference device, the reference model developed based at least in part on measured EL reference data, synthetic EL reference data; or a combination thereof obtained from the reference device or a reference design of the reference device; and determining whether the DUT is in accordance with the reference device or a reference specification of the reference device based at least in part on the comparison.

According to yet another aspect of the disclosure there is thus provided a method for verifying and validating integrated circuits with a controller, including: obtaining synthetic or measured EL data from a plurality of test vectors based on a known good reference; producing a reference model from the synthetic or measured EL data; measure EL data using multiple test vectors from a device under test (DUT); aggregate the measured EL data; comparing the reference model to the measured EL data; determining whether the DUT is within specification of the reference model based on the comparison; and reporting whether the DUT is within specification to a user.

Reference throughout this specification to "one embodiment" or "an embodiment" means that a particular feature, structure, or characteristic described in connection with the embodiment is included in at least one embodiment. Thus, appearances of the phrases "in one embodiment" or "in an embodiment" in various places throughout this specification are not necessarily all referring to the same embodiment. Furthermore, the features, structures, or characteristics may be combined in any suitable manner in one or more embodiments.

What is claimed is:

1. A system for inspecting integrated circuits, comprising:
at least one first detection system for measuring electroluminescent (EL) images from a device under test (DUT);
at least one second detection system for measuring a second measurement from the DUT; and
a controller that is configured to:
measure EL emissions from the DUT with the at least one first detection system and the at least one second detection system to obtain a first EL test data and a second EL test data;
compare the first EL test data and the second EL test data to a reference model of a reference device, the reference model developed based at least in part on measured EL reference data, synthetic EL reference data, or a combination thereof obtained from the reference device or a reference design of the reference device;
convert the reference model to one or more reference images in an image format, wherein the image format is chosen from the group consisting of photon data analysis results mapped to a single channel image of multiple single channel images of frequency results, rise time results, spectral data mapped to the single channel image, and multiple signal channel images converted to a single multichannel reference image of n channels or a stack of images with the n channels;
reduce a dimensionality of the reference images using machine learning techniques to create one or more reduced reference images, wherein the machine learning techniques include at least one of image to image conversion or principal component analysis;
apply a same machine learning techniques to one or more measured images of the DUT to create one or more reduced measured images;
compare the one or more reduced reference images to the one or more reduced measured images; and
determine whether the DUT is in accordance with the reference device, or a reference specification of the reference device, based at least in part on the comparison of the first EL test data and the second EL test data to the reference model the reference device.

2. The system of claim 1, wherein the at least one first detection system comprises a short wave infrared (SWIR) camera, and the controller is configured to measure the EL emissions from the DUT using at least the SWIR camera.

3. The system of claim 1, wherein the at least one second detection system comprises at least one of a synthetic short wave infrared (SWIR) imaging, a hyperspectral imaging, a single photon counting, a time correlated single photon counting detection system, infrared spectroscopy, visible spectroscopy, and combinations thereof.

4. The system of claim 3, wherein the time correlated single photon counting detection system comprises at least a first channel comprising a first single photon detector and a second channel comprising a second single photon detector, and the controller is configured to determine a time difference between first photons arriving at the first channel and second photons arriving at the second channel.

5. The system of claim 1, wherein the reference model is based at least in part on at least first EL reference data and second EL reference data, the first EL reference data and the second EL reference data based on two different modes of measuring or synthesizing the measurement of the EL emissions from the reference device.

6. The system of claim 5, wherein the first EL reference data is measured or synthetic short wave infrared images of the EL emissions from the reference device, and the second EL reference data is measured or synthetic timing data of the EL emissions from the reference device.

7. The system of claim 1, wherein the controller further comprises a trust analysis module (TAM), wherein the TAM is configured to compare EL test data to the reference model or the reference specification of the reference device to determine whether a DUT is within the reference specification.

8. A method of inspecting integrated circuits, comprising, with a controller:
obtaining a first electroluminescent (EL) test data of a device under test (DUT) at least in part by measuring EL emissions from the DUT using at least one first detection system;
obtaining a second EL test data of the DUT at least in part by measuring the EL emissions from regions of the DUT using at least one second detection system;
comparing the first EL test data and the second EL test data to a reference model of a reference device, the reference model developed based at least in part on measured EL reference data, synthetic EL reference data; or a combination thereof obtained from the reference device or a reference design of the reference device;
converting the reference model to one or more reference images in an image format, wherein the image format is chosen from the group consisting of photon data analysis results mapped to a single channel image of multiple single channel images of frequency results, rise time results, spectral data mapped to the single channel image, and multiple signal channel images converted to a single multichannel reference image of n channels or a stack of images with the n channels;
reducing a dimensionality of the reference images using machine learning techniques to create one or more reduced reference images, wherein the machine learning techniques include at least one of image to image conversion or principal component analysis;

applying a same machine learning techniques to one or more measured images of the DUT to create one or more reduced measured images;

comparing the one or more reduced reference images to the one or more reduced measured images; and determining whether the DUT is in accordance with the reference device or a reference specification of the reference device based at least in part on the comparison.

9. The method of claim 8, wherein the EL reference data is used to modify a setup to reduce an image acquisition time and a number of modalities used for the comparison of first EL test data and the second EL test data.

10. The method of claim 8, wherein the at least one second detection system comprises at least one of a synthetic short wave infrared (SWIR) imaging, a hyperspectral imaging, a single photon counting, a time correlated single photon counting detection system, infrared spectroscopy, visible spectroscopy, and combinations thereof.

11. The method of claim 8 further comprising:

determining a DUT activity type based on one or more EL activity maps;

comparing the DUT activity type to an activity type of a reference circuit; and determining whether the DUT passes based on the comparison of the DUT activity type to the activity type of the reference circuit.

12. The method of claim 8, wherein the reference model is based at least in part on at least first EL reference data and second EL reference data, the first EL reference data and the second EL reference data based on two different modes of measuring or synthesizing the measurement of the EL emissions from the reference device.

13. A method for verifying and validating integrated circuits, comprising, with a controller:

obtaining synthetic or measured EL data from a plurality of test vectors based on a known good reference;

producing a reference model from the synthetic or measured EL data;

converting the reference model to one or more reference images in an image format;

reducing a dimensionality of the reference images using machine learning techniques to create one or more reduced reference images, wherein the machine learning techniques include at least one of image to image conversion or principal component analysis;

applying a same machine learning techniques to one or more measured images of the DUT to create one or more reduced measured images;

comparing the one or more reduced reference images to the one or more reduced measured images;

measure EL data using multiple test vectors from a device under test (DUT);

aggregate the measured EL data;

comparing the reference model to the measured EL data;

determining whether the DUT is within specification of the reference model based on the comparison; and reporting whether the DUT is within specification to a user.

14. The method of claim 13, wherein the reference model is created using a machine learning model.

15. The method of claim 13, wherein the reference model is used to modify a setup to reduce an image acquisition time and a number of modalities used for the comparison of the measured EL data.

16. The method of claim 13 further comprising:

determining a DUT activity type based on one or more EL activity maps;

comparing the DUT activity type to an activity type of a reference circuit; and determining whether the DUT passes based on the comparison of the DUT activity type to the activity type of the reference circuit.

17. The method of claim 13, wherein the reference model is based at least in part on at least first EL reference data and second EL reference data, the first EL reference data and the second EL reference data based on two different modes of measuring or synthesizing the measurement of the EL emissions from a reference device.

* * * * *